United States Patent
Chung et al.

(10) Patent No.: US 11,456,254 B2
(45) Date of Patent: Sep. 27, 2022

(54) THREE-DIMENSIONAL SEMICONDUCTOR MEMORY DEVICE

(71) Applicant: SAMSUNG ELECTRONICS CO., LTD., Suwon-si (KR)

(72) Inventors: Jisoo Chung, Seoul (KR); Kang-Won Lee, Hwaseong-si (KR); Sung-Min Hwang, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 184 days.

(21) Appl. No.: 17/027,734

(22) Filed: Sep. 22, 2020

(65) Prior Publication Data

US 2021/0265271 A1  Aug. 26, 2021

(30) Foreign Application Priority Data

Feb. 25, 2020  (KR) .................... 10-2020-0023100

(51) Int. Cl.
*H01L 23/535* (2006.01)
*H01L 27/11519* (2017.01)
(Continued)

(52) U.S. Cl.
CPC ...... *H01L 23/535* (2013.01); *H01L 21/76805* (2013.01); *H01L 21/76895* (2013.01);
(Continued)

(58) Field of Classification Search
CPC ....... H01L 2225/06541–06544; H01L 23/481; H01L 27/11273; H01L 27/11514;
(Continued)

(56) References Cited

U.S. PATENT DOCUMENTS 8,921,918 B2   12/2014  Shim et al.
9,023,702 B2   5/2015   Lee
(Continued)

FOREIGN PATENT DOCUMENTS

KR   1020170086347 A   7/2017
KR   10-1774477 B1     9/2017
(Continued)

*Primary Examiner* — Amar Movva
(74) *Attorney, Agent, or Firm* — Volentine, Whitt & Francos, PLLC

(57) ABSTRACT

A three-dimensional semiconductor memory device includes; a first block and a second block arranged on a first substrate in a first direction, wherein each of the first block and the second block includes electrode layers stacked on the first substrate, a source layer interposed between the first block and the first substrate, and between the second block and the first substrate, a first insulating separation pattern interposed between the first block and the second block and extending in the first direction, wherein the first insulating separation pattern includes a line portion and a protruding portion, the line portion extending in a second direction crossing the first direction, and the protruding portion having a width greater than a width of the line portion, a first source contact plug penetrating the protruding portion of the first insulating separation pattern to electrically connect the source layer, and at least one through via penetrating the source layer and at least one of the first block and the second block.

20 Claims, 25 Drawing Sheets

(51) Int. Cl.
*H01L 27/11556* (2017.01)
*H01L 27/11529* (2017.01)
*H01L 21/768* (2006.01)
*H01L 27/11582* (2017.01)
*H01L 27/11573* (2017.01)
*H01L 27/11565* (2017.01)

(52) U.S. Cl.
CPC .. *H01L 27/11519* (2013.01); *H01L 27/11529* (2013.01); *H01L 27/11556* (2013.01); *H01L 27/11565* (2013.01); *H01L 27/11573* (2013.01); *H01L 27/11582* (2013.01)

(58) Field of Classification Search
CPC .......................... H01L 27/11551–11556; H01L 27/11578–11582; H01L 27/11597; H01L 27/2481–249
See application file for complete search history.

(56) References Cited

U.S. PATENT DOCUMENTS

| | | |
|---|---|---|
| 9,559,116 B2 | 1/2017 | Kim et al. |
| 9,711,532 B2 | 7/2017 | Miyamoto et al. |
| 10,199,359 B1 | 2/2019 | Sakakibara et al. |
| 10,381,443 B2 | 8/2019 | Matsumoto et al. |
| 10,403,633 B2 | 9/2019 | Lee |
| 10,468,422 B2 | 11/2019 | Lee |
| 2012/0208347 A1 | 8/2012 | Hwang et al. |
| 2019/0221557 A1 | 7/2019 | Kim et al. |
| 2019/0244970 A1 | 8/2019 | Jung et al. |

FOREIGN PATENT DOCUMENTS

| | | |
|---|---|---|
| KR | 1020190029318 A | 3/2019 |
| KR | 1020190095812 A | 9/2019 |

THREE-DIMENSIONAL SEMICONDUCTOR MEMORY DEVICE

CROSS-REFERENCE TO RELATED APPLICATIONS

This U.S. non-provisional patent application claims priority under 35 U.S.C. § 119 to Korean Patent Application No. 10-2020-0023100 filed on Feb. 25, 2020 in the Korean Intellectual Property Office, the subject matter of which is hereby incorporated by reference.

BACKGROUND

The inventive concept relates generally to three-dimensional (3D) semiconductor memory devices, and more particularly, to 3D semiconductor memory devices exhibiting high reliability and high integration density.

Higher integration of semiconductor devices is required to satisfy consumer demands for superior performance and inexpensive prices. Since integration density is an important factor in determining the price of semiconductor devices, it is highly desirable. In the case of two-dimensional or planar semiconductor devices, integration is chiefly a product of the area occupied by a unit memory cell, and integration density is largely a function of fine pattern formation(s). However, the extremely expensive process equipment needed to increase pattern fineness sets a practical limitation on increasing integration for two-dimensional semiconductor devices. Thus, 3D semiconductor memory devices including a three-dimensional arrangement of memory cells have recently been proposed.

SUMMARY

Embodiments of the inventive concept provide highly reliable and densely integrated 3D semiconductor memory device.

According to embodiments of the inventive concept, a three-dimensional semiconductor memory device may include; a first block and a second block arranged on a first substrate in a first direction, wherein each of the first block and the second block includes electrode layers stacked on the first substrate, a source layer interposed between the first block and the first substrate, and between the second block and the first substrate, a first insulating separation pattern interposed between the first block and the second block and extending in the first direction, wherein the first insulating separation pattern includes a line portion and a protruding portion, the line portion extending in a second direction crossing the first direction, and the protruding portion having a width greater than a width of the line portion, a first source contact plug penetrating the protruding portion of the first insulating separation pattern to electrically connect the source layer, and at least one through via penetrating the source layer and at least one of the first block and the second block.

According to embodiments of the inventive concept, a three-dimensional semiconductor memory device may include; a first block and a second block arranged on a first substrate and in a first direction, a source layer interposed between the first block and the first substrate, and between the second block and the first substrate, a first insulating separation pattern interposed between the first block and the second block and extending in a second direction crossing the first direction, and a first source contact plug penetrating the first insulating separation pattern to electrically connect the source layer, wherein the first insulating separation pattern comprises a first portion and a second portion, the first portion enclosing the first source contact plug, and the second portion connected to the first portion and extending in the second direction, the first portion has a first width in the first direction, the second portion has a second width in the first direction, and the first width is greater than the second width.

According to embodiments of the inventive concept, a three-dimensional semiconductor memory device may include; a first block and a second block arranged on a first substrate and in a first direction, a source layer interposed between the first block and the first substrate, and between the second block and the first substrate, a first insulating separation pattern interposed between the first block and the second block and extending in a second direction crossing the first direction, and a first source contact plug penetrating the first insulating separation pattern to electrically connect the source layer, wherein each of the first block and the second block includes alternately stacked electrode layers and electrode interlayer insulating layers disposed on the source layer, vertical semiconductor patterns penetrating the electrode interlayer insulating layers and the electrode layers, and memory patterns respectively interposed between the vertical semiconductor patterns and the electrode layers, the first insulating separation pattern include a first portion and a second portion, the first portion enclosing the first source contact plug, and the second portion being connected to the first portion and extending in the second direction, the vertical semiconductor patterns include a first vertical semiconductor pattern and a second vertical semiconductor pattern, the first vertical semiconductor pattern being closest to the first portion, and the second vertical semiconductor pattern being closest to the second portion, and a first distance between the first portion and the first vertical semiconductor pattern is less than a second distance between the second portion and the second vertical semiconductor pattern.

DETAILED DESCRIPTION

Throughout the written description and drawings, like reference numbers and labels are used to denote like or similar elements and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Figure 1:
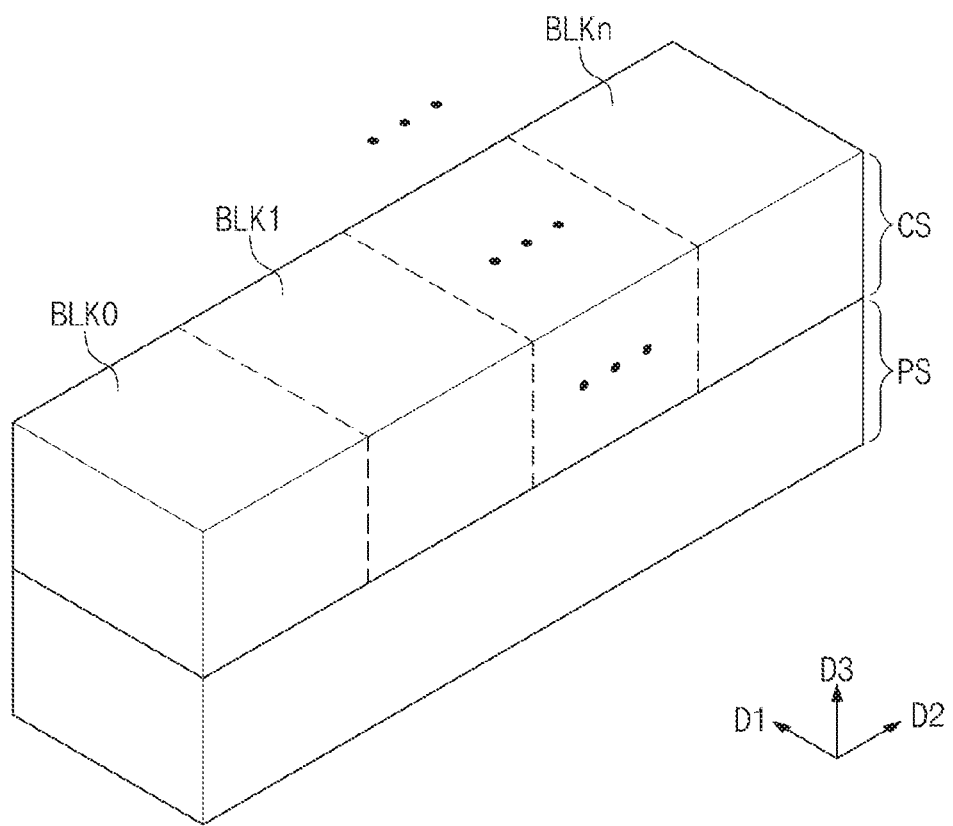
FIG. 1 is a perspective diagram illustrating one possible structure of a 3D semiconductor memory device according to embodiments of the inventive concept.

Figure (FIG. 1 is a block diagram illustrating a three-dimensional (3D) semiconductor memory device according to embodiments of the inventive concept. Here, the 3D semiconductor memory device may generally include a peripheral logic structure PS, a cell array structure CS disposed on the peripheral logic structure PS, and an interconnection structure connecting elements, components and/or regions of the cell array structure CS to elements, components and/or regions of the peripheral logic structure PS.

The peripheral logic structure PS may include, for example, row and column decoder(s), page buffer(s), and various control circuits.

The cell array structure CS may be disposed on (or overlay) the peripheral logic structure PS. The cell array structure CS may include a plurality of memory blocks BLK0 to BLKn, wherein each block is configured to independently perform an erase operation. Each of the memory blocks BLK0 to BLKn may include a memory cell array having a 3D (or vertical) structure.

Figure 2:
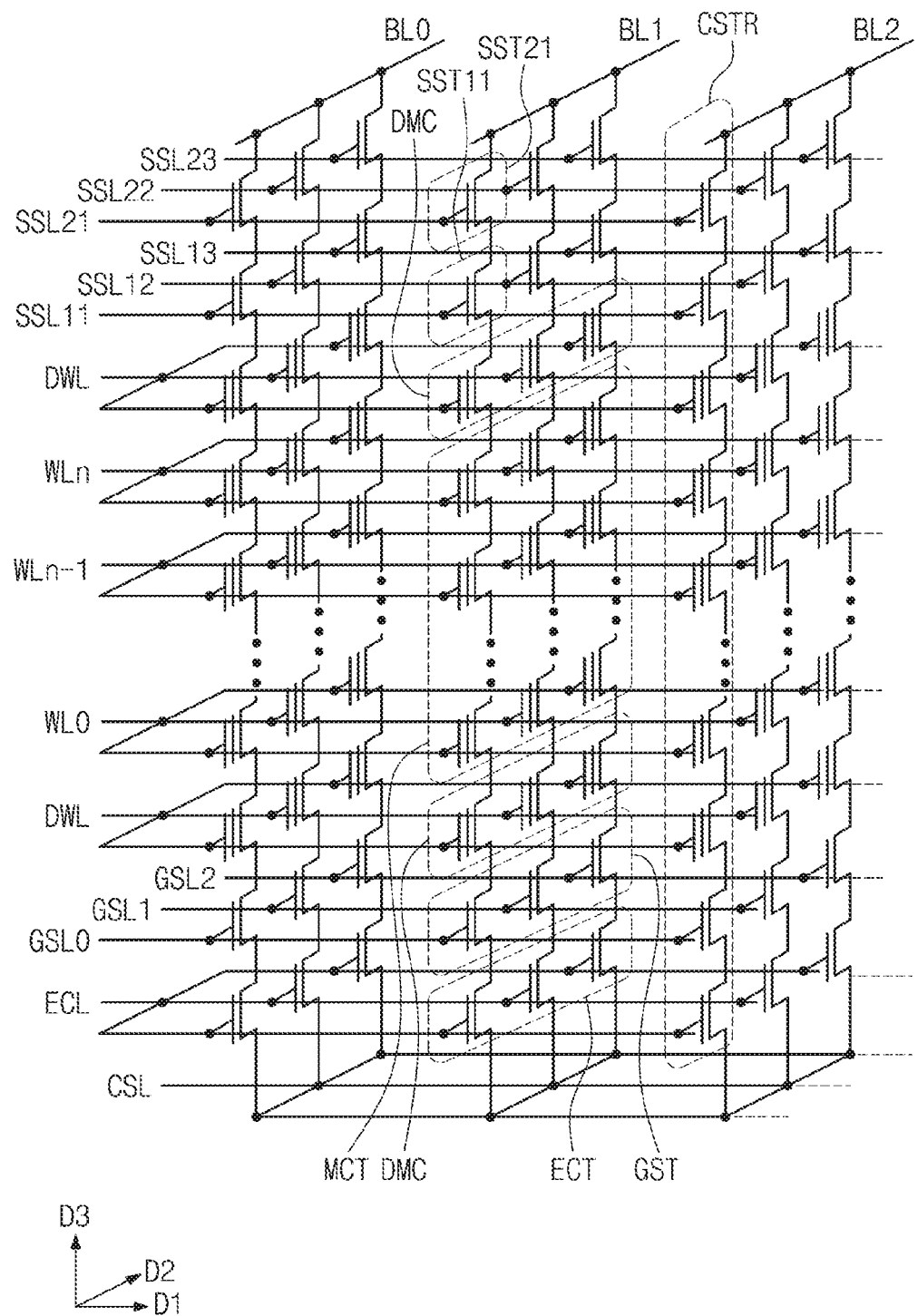
FIG. 2 is a partial circuit diagram illustrating in one example a cell array of a 3D semiconductor memory device according to embodiments of the inventive concept.

FIG. 2 is a partial circuit diagram illustrating in one example a cell array of a 3D semiconductor memory device according to embodiments of the inventive concept.

Referring to FIG. 2, each of the memory blocks BLK0 to BLKn may include cell strings CSTR, two-dimensionally arranged in first direction D1 and second directions D2 crossing the first direction D1, and extending in a third direction D3. A plurality of the cell strings CSTR may be connected in parallel to each of bit lines BL0 to BL2. The cell strings CSTR may be connected in common to a common source line CSL.

One of the cell strings CSTR may include serially-connected string selection transistors SST21 and SST11, serially-connected memory cell transistors MCT, a ground selection transistor GST, and an erase control transistor ECT.

Each of the memory cell transistors MCT may include a data storage element. One of the cell strings CSTR may further include dummy cells DMC, which are provided between a (1-1)-th string selection transistor SST11 and the memory cell transistor MCT and between the ground selection transistor GST and the memory cell transistor MCT to connect them to each other. The remaining ones of the cell strings CSTR may be the same or similar structure as them.

The (1-1)-th string selection transistor SST11 may be controlled by an (1-1)-th string selection line SSL11, and a (2-1)-th string selection transistor SST21 may be controlled by a (2-1)-th string selection line SSL21. The memory cell transistors MCT may be controlled by a plurality of word lines WL0 to WLn, respectively, and the dummy cells DMC may be controlled by a dummy word line DWL. The ground selection transistor GST may be controlled by ground selection lines GSL0 to GSL2, and the erase control transistor ECT may be controlled by an erase control line ECL.

Gate electrodes of the memory cell transistors MCT, disposed substantially at the same height (e.g., measured in the third direction D3) from the common source lines CSL, may be connected in common to one of the word lines WL0-WLn and may be in an equipotential state. Alternatively, although the gate electrodes of the memory cell transistors MCT are disposed at substantially the same height from the common source lines CSL, some of them (e.g., those disposed in different rows or columns) may be independently controlled.

Figure 3:
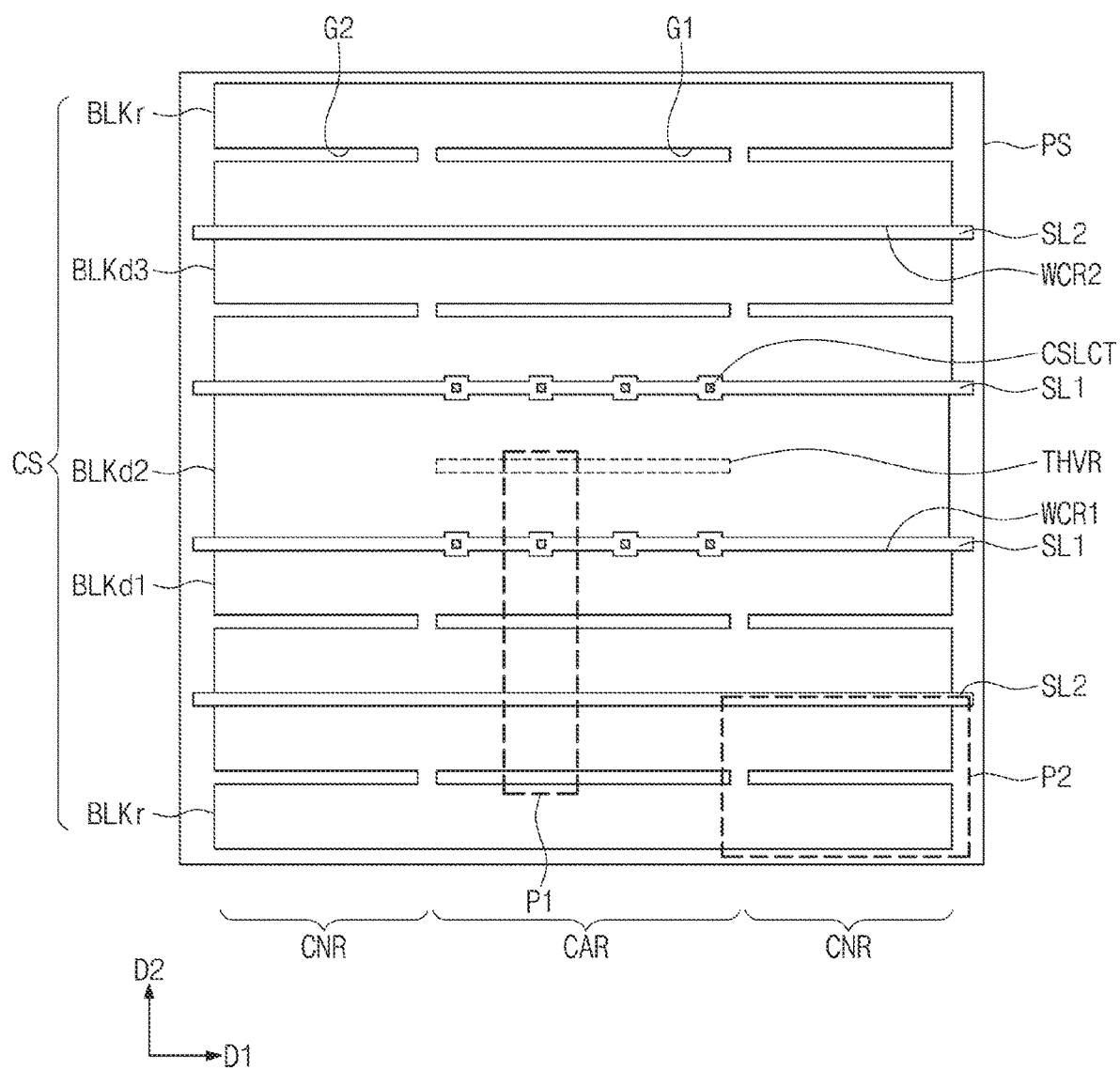
FIG. 3 is a plan (or top down) view illustrating a 3D semiconductor memory device according to embodiments of the inventive concept.
Figure 4A:
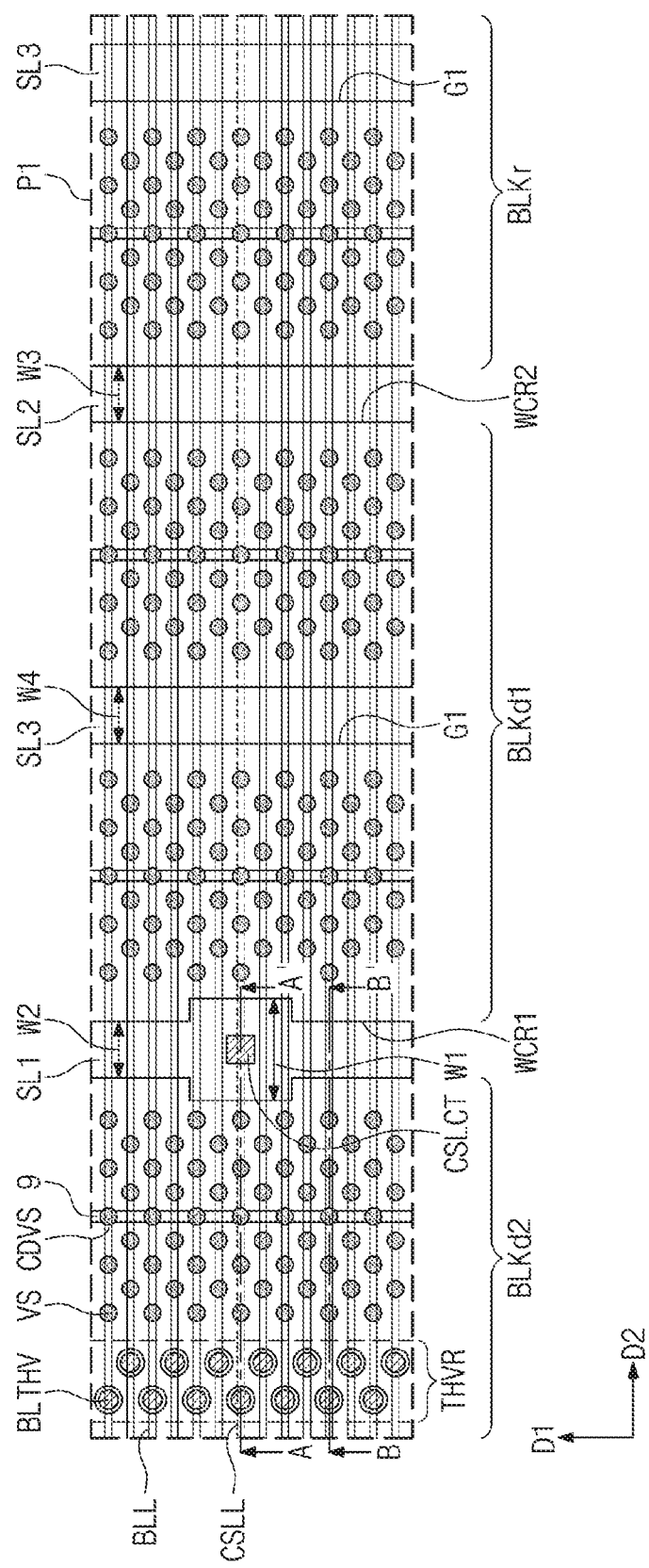
FIG. 4A is a plan view further illustrating the portion 'P1' of FIG. 3.
Figure 4B:
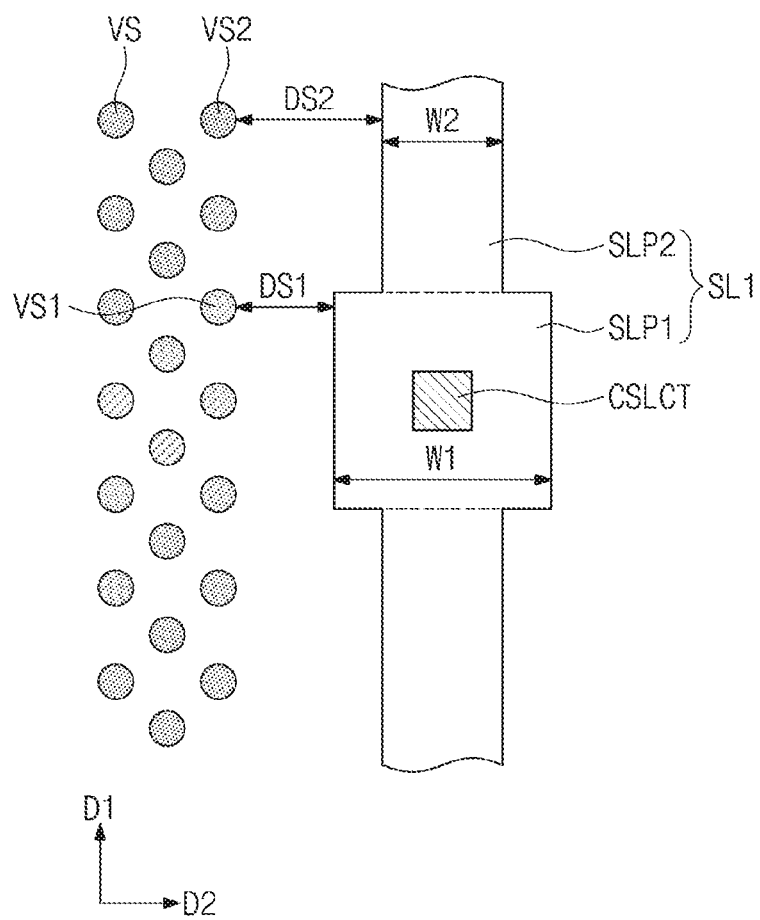
FIG. 4B is a plan view further illustrating the first insulating separation pattern of FIG. 4A and its neighboring region.
Figure 5:
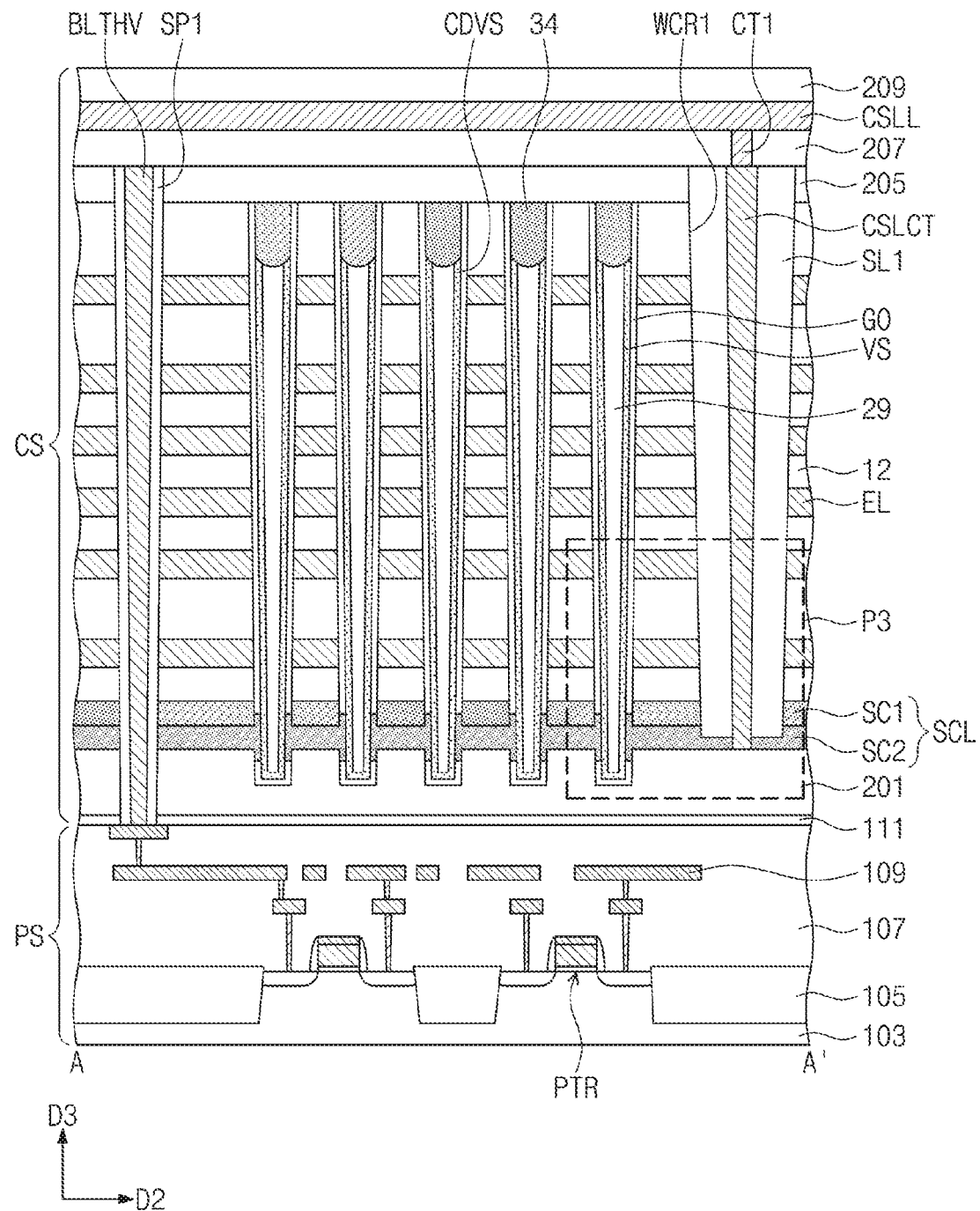
FIG. 5 is a cross-sectional view taken along a line A-A' of FIG. 4A.
Figure 6:
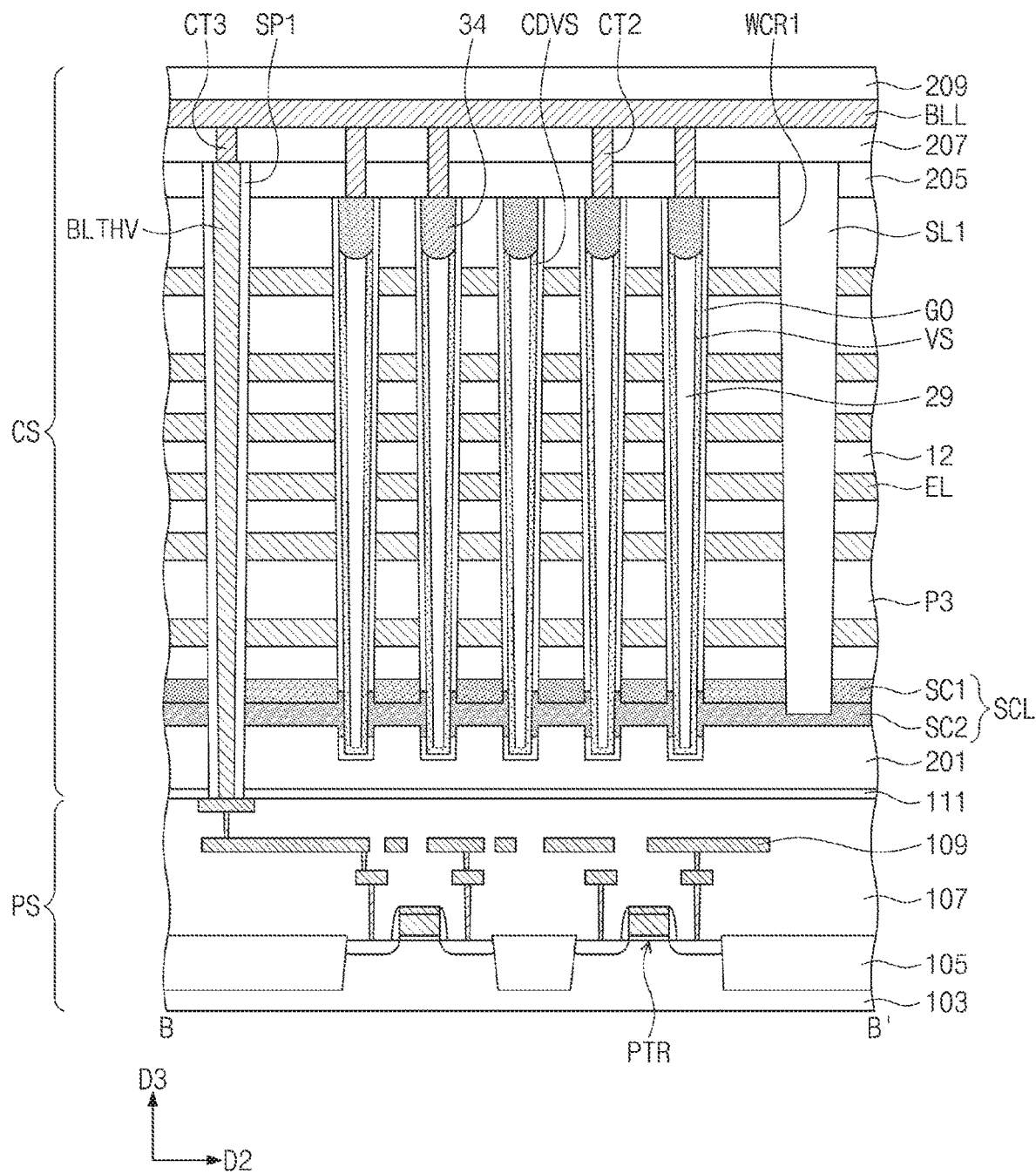
FIG. 6 is a cross-sectional view taken along a line B-B' of FIG. 4A.
Figure 7:
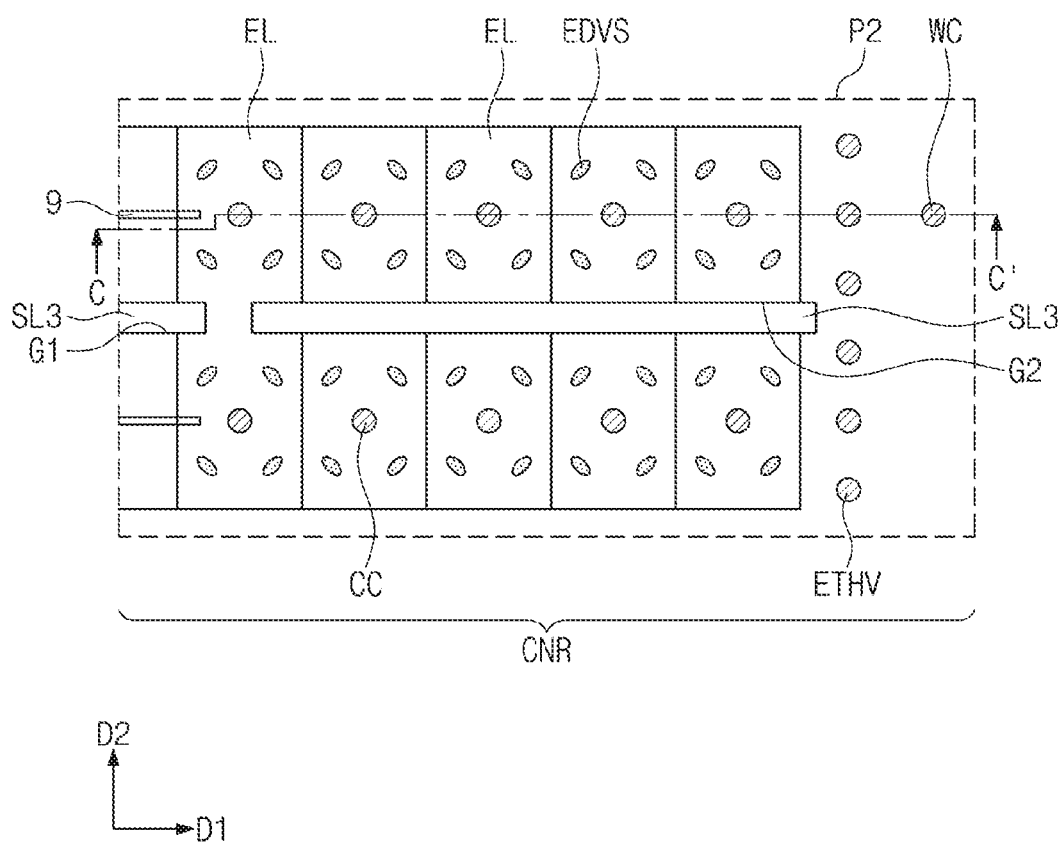
FIG. 7 is a plan view further illustrating the portion 'P2' of FIG. 3.
Figure 8:
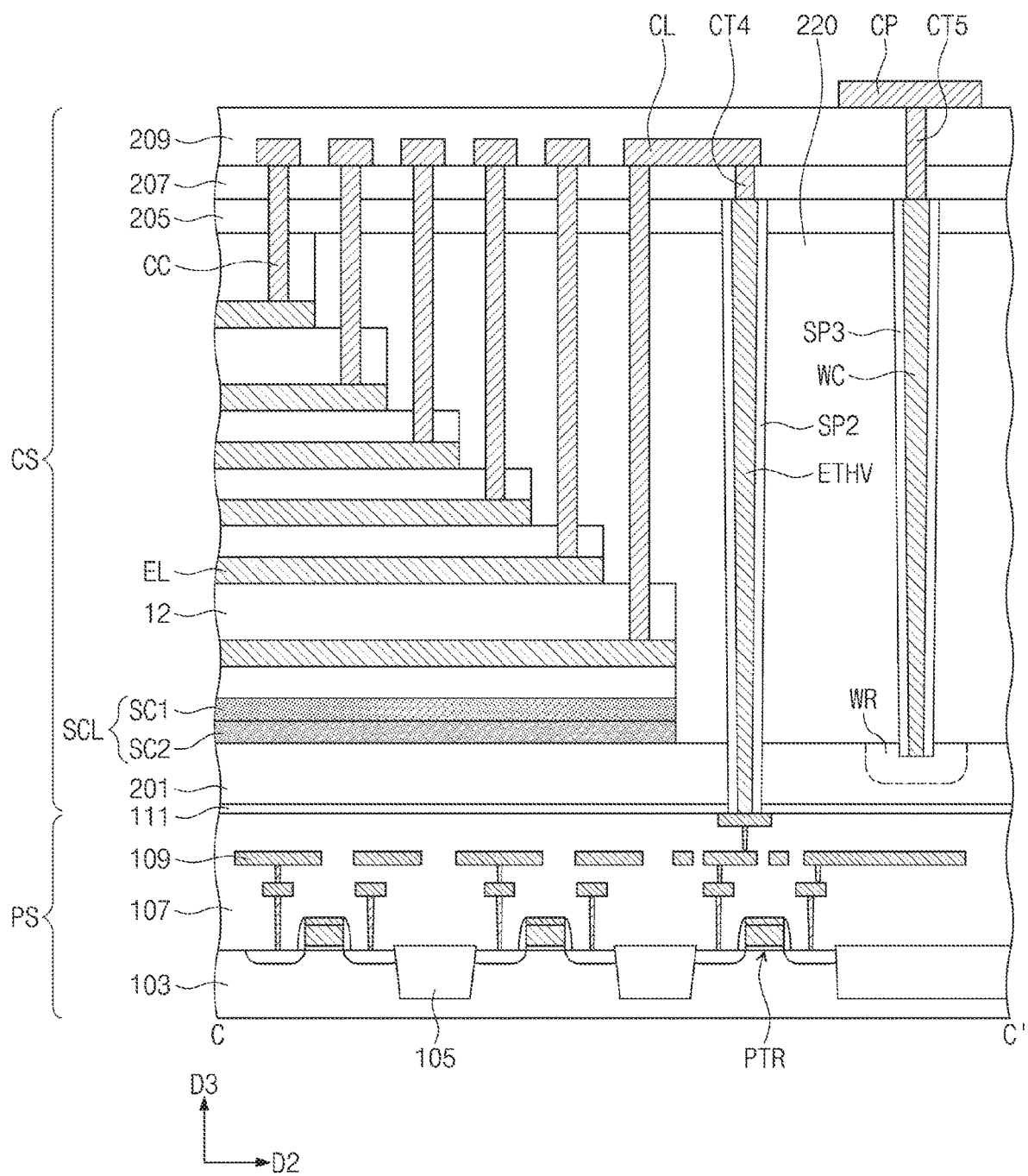
FIG. 8 is a cross-sectional view taken along a line C-C' of FIG. 7.
Figure 9:
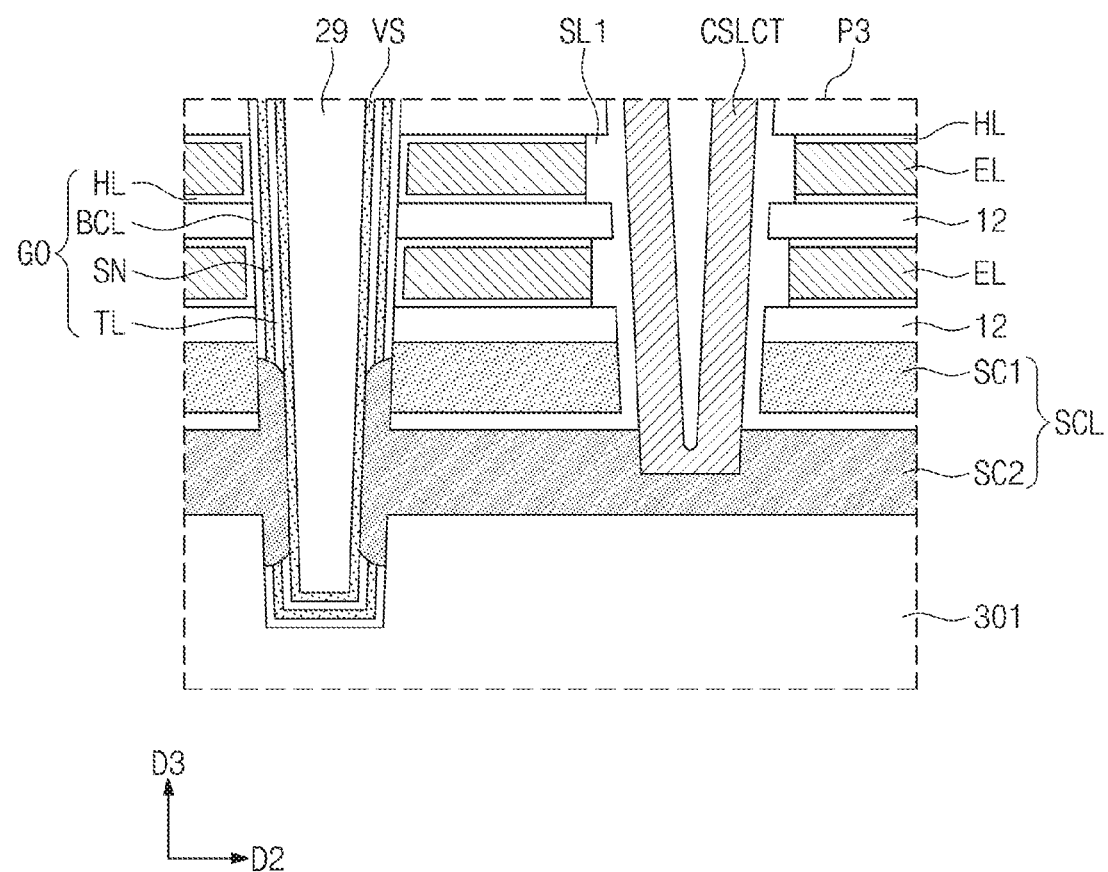
FIG. 9 is a cross-sectional view further illustrating the portion 'P3' of FIG. 5.

FIG. 3 is a plan view illustrating a 3D semiconductor memory device according to embodiments of the inventive concept; FIG. 4A is a plan view further illustrating the portion 'P1' of FIG. 3; FIG. 4B is a plan view further illustrating the first insulating separation pattern of FIG. 4A and its neighboring region; FIG. 5 is a cross-sectional view taken along a line A-A' of FIG. 4A; FIG. 6 is a cross-sectional view taken along a line B-B' of FIG. 4A; FIG. 7 is a plan view further illustrating the portion 'P2' of FIG. 3; FIG. 8 is a cross-sectional view taken along a line C-C' of FIG. 7; and FIG. 9 is a cross-sectional view further illustrating the portion 'P3' of FIG. 5.

Referring to FIGS. 3 and 5, the cell array structure CS may be disposed on the peripheral logic structure PS. When viewed in a plan view, the cell array structure CS may include real blocks BLKr arranged in the second direction D2. The real blocks BLKr may correspond to each of the memory blocks BLK0 to BLKn described with reference to FIGS. 1 and 2 and may be memory blocks on which various operations (e.g., read, write and erase operations) may be selectively performed. Dummy blocks BLKd1 to BLKd3 may be disposed between two adjacent ones of the real blocks BLKr at predetermined positions. The dummy blocks BLKd1 to BLKd3 may include first to third dummy blocks BLKd1 to BLKd3 and may be arranged in the second direction D2. The dummy blocks BLKd1 to BLKd3 do not serve as memory blocks. That is, read, write and erase operations are not performed on the memory cells of the dummy blocks BLKd1 to BLKd3.

Referring to FIG. 3, first insulating separation patterns SL1 may be respectively interposed between the first dummy block BLKd1 and the second dummy block BLKd2 and between the second dummy block BLKd2 and the third dummy block BLKd3. The first insulating separation pattern SL1 may be disposed in a first word-line cut region WCR1. A second insulating separation pattern SL2 may be interposed between the first dummy block BLKd1 and the real block BLKr adjacent thereto, and between the third dummy block BLKd3 and the real block BLKr adjacent thereto. The second insulating separation pattern SL2 may be disposed in a second word-line cut region WCR2. The first insulating separation pattern SL1 and the second insulating separation pattern SL2 may be line-shaped patterns extending in the first direction D1. The first and second insulating separation patterns SL1 and SL2 may respectively have a single-layer structure or a multi-layer structure and may be formed from (or include) at least one of silicon oxide, silicon nitride, silicon oxynitride and other porous insulating materials.

Source contact plugs CSLCT may be disposed in the first insulating separation pattern SL1. Here, the source contact plugs CSLCT may penetrate the first insulating separation pattern SL1. Exemplary configurations of the first and second insulating separation patterns SL1 and SL2 and the source contact plugs CSLCT will be described in some additional detail hereafter.

Referring to FIG. 3, each of the real blocks BLKr and the dummy blocks BLKd1 to BLKd3 may include a cell array region CAR and connection regions CNR provided at opposite ends of the cell array region CAR. Each of the real blocks BLKr and the first and third dummy blocks BLKd1 and BLKd3 may include a first groove G1 provided in the cell array region CAR and extending in the first direction D1. Each of the real blocks BLKr and the first and third dummy blocks BLKd1 and BLKd3 may include second grooves G2 respectively provided in the connection regions CNR. In each of the real blocks BLKr and the dummy blocks BLKd1 to BLKd3, the first groove G1 and the second grooves G2 may extend in a straight line and may be spaced apart from each other.

In certain embodiments of the inventive concept, the second dummy block BLKd2 may not include the first groove G1 and the second grooves G2. That is, the second dummy block BLKd2 may include a through-via region THVR provided in a region corresponding to the first groove G1. Exemplary configurations of the bit-line through vias BLTHV will be described in some additional detail hereafter with reference to FIG. 5.

Referring to FIGS. 4A to 6, the peripheral logic structure PS may include a first substrate 103. The first substrate 103 may be a single-crystalline silicon wafer or a silicon-on-insulator (SOI) wafer. A device isolation layer 105 may be disposed in the first substrate 103 to delimit active regions. Peripheral transistors PTR may be disposed on the active regions. Each of the peripheral transistors PTR may include a peripheral gate electrode, a peripheral gate insulating layer, and peripheral source/drain regions, which are provided in two opposite portions of the first substrate 103 and at both sides of the peripheral gate electrode. The peripheral transistors PTR may be coved with a peripheral interlayer insulating layer 107. The peripheral interlayer insulating layer 107 may be formed from at least one of silicon oxide, silicon nitride, silicon oxynitride, and other porous insulating materials, and may have a single-layer or a multi-layer structure. Peripheral interconnection lines 109 may be disposed in the peripheral interlayer insulating layer 107. The peripheral interconnection lines 109 may include a conductive layer. The peripheral interconnection lines 109 may be electrically connected to the peripheral transistors PTR. The peripheral interconnection lines 109 and the peripheral transistors PTR may constitute a page buffer circuit and a decoder circuit.

The cell array structure CS may be disposed on the peripheral interlayer insulating layer 107. Each of the blocks BLKr and BLKd1 to BLKd3 included in the cell array structure CS may include an etch stop layer 111, a second substrate 201, and a source layer SCL, which are sequentially stacked, and electrode layers EL and electrode interlayer insulating layers 12, which are alternately stacked on the source layer SCL. The second substrate 201 may be formed from (e.g.,) a single-crystalline silicon layer, a silicon epitaxial layer, or an SOI substrate. The second substrate 201 may be doped with impurities of a first conductivity type (e.g., a P-type impurity, such as boron or an N-type impurity, such as arsenic or phosphorus). The etch stop layer 111 may be formed from at least one of silicon oxide, silicon nitride, or silicon oxynitride and may have a single-layer or a multi-layer structure.

Referring to FIGS. 2 and 5, a lowermost layer of the electrode layers EL may correspond to the erase control line ECL of FIG. 2. A second lowermost layer of the electrode layers EL may correspond to one of (e.g.,) the ground selection lines GSL0, GSL1, and GSL2 of FIG. 2. A topmost layer of the electrode layers EL may correspond to the string selection lines SSL11-SSL13 and SSL21-SSL23 of FIG. 2. In each of the blocks BLKr, BLKd1, and BLKd3, the topmost layer of the electrode layers EL may be divided into a plurality of lines, which serve as the string selection lines SSL11-SSL13 and SSL21-SSL23, by a central separation pattern 9 and the first groove G1. The electrode layers EL may be formed from at least one of doped semiconductor (e.g., doped silicon), metals (e.g., tungsten, copper and aluminum), conductive metal nitrides (e.g., titanium nitride and tantalum nitride), or transition metals (e.g., titanium and tantalum). The electrode interlayer insulating layers 12 may be formed from at least one of silicon oxide, silicon nitride, silicon oxynitride, porous insulating materials and may have a single-layer or a multi-layer structure.

The source layer SCL may include a first source pattern SC1 interposed between the lowermost layer of the electrode interlayer insulating layers 12 and the second substrate 201, and a second source pattern SC2 interposed between the first source pattern SC1 and the second substrate 201. The first source pattern SC1 may include one doped semiconductor pattern (e.g., a polysilicon pattern doped with impurities of the first conductivity type). The second source pattern SC2 may include a doped semiconductor pattern (e.g., a doped polysilicon pattern). The second source pattern SC2 may include another semiconductor material different from that of the first source pattern SC1. For example, the second source pattern SC2 may include the same conductivity type as the first source pattern SC1, but the doping concentration of the second source pattern SC2 may be different from that of the first source pattern SC1. The source layer SCL may correspond to the common source line CSL of FIG. 2.

Referring to FIGS. 4A and 5, in the cell array region CAR of each of the blocks BLKr and BLKd1 to BLKd3, the electrode interlayer insulating layers 12 and the electrode layers EL may be penetrated by vertical semiconductor patterns VS and central dummy vertical patterns CDVS. The central dummy vertical patterns CDVS may be arranged in the first direction D1 to form a single column. The central separation pattern 9 may be disposed between upper portions of the central dummy vertical patterns CDVS. A gate insulating layer GO may be interposed between the electrode layers EL and the vertical semiconductor patterns VS, and between the electrode layers EL and the central dummy vertical patterns CDVS. Each of the vertical semiconductor patterns VS and the central dummy vertical patterns CDVS may be shaped (e.g.,) like a hollow cup. The vertical semiconductor patterns VS and the central dummy vertical patterns CDVS may be formed from (e.g.,) single-crystalline or poly-crystalline silicon. An insulating gapfill pattern 29 may be provided to fill an inner space of each of the vertical semiconductor patterns VS and the central dummy vertical patterns CDVS. The insulating gapfill pattern 29 may be formed from at least one of silicon oxide, silicon nitride, and silicon oxynitride and may have a single-layer structure or a multi-layer structure. A bit line pad 34 may be disposed on each of the vertical semiconductor patterns VS and the central dummy vertical patterns CDVS. The bit line pad 34 may be formed from doped polysilicon or metal(s) (e.g., tungsten, aluminum, and copper). The second source pattern SC2 may be provided to penetrate the gate insulating layer GO in order to contact each of lower side surfaces of the vertical semiconductor patterns VS and the central dummy vertical patterns CDVS.

Referring to FIGS. 5 and 9, the gate insulating layer GO may include a tunnel insulating layer TL, a charge storing layer SN, and a blocking insulating layer BCL. The charge storing layer SN may be a trap insulating layer, a floating gate electrode, or an insulating layer with conductive nano dots. In certain embodiments, the charge storing layer SN may include at least one of silicon nitride, silicon oxynitride, silicon-rich nitride, nanocrystalline silicon, and laminated trap layers. The tunnel insulating layer TL may be formed from at least one of materials having band gaps greater than that of the charge storing layer SN, and the blocking insulating layer BCL may be formed of a high-k dielectric material (e.g., aluminum oxide and hafnium oxide). The gate insulating layer GO may further include a high-k dielectric layer HL. The high-k dielectric layer HL may be interposed between the blocking insulating layer BCL and the electrode layers EL. The high-k dielectric layer HL may be interposed between the electrode layers EL and the electrode interlayer insulating layers 12. The high-k dielectric layer HL may be formed from at least one of metal oxides (e.g., hafnium oxide and aluminum oxide) having a dielectric constant higher than that of silicon oxide. The gate insulating layer GO may include lower and upper portions separated from each other by the second source pattern SC2. The first insulating separation pattern SL1 may include a portion protruding towards the electrode layer EL (e.g., in the second direction D2) and interposed between the electrode interlayer insulating layers 12. A side surface of the first insulating separation pattern SL1 may have an uneven (or concavo-convex) structure. The side surfaces of the second and third insulating separation patterns SL2 and SL3 may have the same or similar structure as the first insulating separation pattern SL1.

A first interlayer insulating layer 205 may be disposed on the topmost layer of the electrode interlayer insulating layers 12. The first insulating separation pattern SL1 may penetrate the first interlayer insulating layer 205, the electrode layers EL, and the electrode interlayer insulating layers 12. A source contact plug CSLCT enclosed by the first insulating separation pattern SL1 may be electrically connected to the source layer SCL. The source contact plug CSLCT may contact the second source pattern SC2 and the second substrate 201.

Referring to FIGS. 4A and 4B, the first insulating separation pattern SL1 may include a first portion SLP1 enclosing the source contact plug CSLCT, and a second portion SLP2 extending from the first portion SLP1 in the first direction D1 and is spaced apart from the source contact plug CSLCT. The first portion SLP1 and the second portion SLP2 may be provided as a single element. The first portion SLP1 may be referred to as a "protruding portion," and the second portion SLP2 may be referred to as a "line portion." The first portion SLP1 may have a first width W1 and the second portion SLP2 may have a second width W2, as measured in the second direction D2 where the first width W1 is greater than the second width W2.

A portion of the first portion SLP1 may protrude outward from both side surfaces of the second portion SLP2 (e.g., towards the first dummy block BLKd1 and the second dummy block BLKd2). Accordingly, in each of the first dummy block BLKd1 and the second dummy block BLKd2, a first distance DS1 between a first vertical semiconductor pattern VS1, which is one of the first dummy the vertical semiconductor patterns VS closest to the first portion SLP1, and the first portion SLP1 may be less than a second distance DS2 between a second vertical semiconductor pattern VS2, which is one of the vertical semiconductor patterns VS closest to the second portion SLP2 and the second portion SLP2. The second width W2 may be less than the second distance DS2. In certain embodiments, the second width W2 may range from about 50 nm to about 150 nm (e.g., about 107 nm in particular). The second distance DS2 may range from about 60 nm to 160 nm (e.g., about 113 nm in particular). When viewed in the plan view of FIG. 4B, each of the first portion SLP1 and the source contact plug CSLCT may have (e.g.,) a rectangular, a circular or a tetragonal shape. The source contact plug CSLCT may be disposed at a center of the first portion SLP1.

Referring to FIGS. 4A and 7, the second insulating separation pattern SL2 may have the same cross-section as that of the first insulating separation pattern SL1 of FIG. 6. The second insulating separation pattern SL2 may penetrate the first interlayer insulating layer 205, the electrode layers EL, and the electrode interlayer insulating layers 12. The second insulating separation pattern SL2 may have a third width W3, as measured in the second direction D2. The third insulating separation pattern SL3 may be disposed in the first groove G1 and the second groove G2. The third insulating separation pattern SL3 may have the same cross-section as that of the first insulating separation pattern SL1 of FIG. 6. The third insulating separation pattern SL3 may penetrate the first interlayer insulating layer 205, the electrode layers EL, and the electrode interlayer insulating layers 12. The third insulating separation pattern SL3 may have a fourth width W4, as measured in the second direction D2. Here, the third width W3 and the fourth width W4 may be substantially equal to the first width W1. And the second and third insulating separation patterns SL2 and SL3 may extend in the first direction D1 and may have a uniform width.

Referring to FIGS. 4A and 5, in the through-via region THVR of the second dummy block BLKd2, bit-line through vias BLTHV may penetrate the first interlayer insulating layer 205, the electrode layers EL, the electrode interlayer insulating layers 12, the source layer SCL, the second substrate 201, and the etch stop layer 111 in order to connect the peripheral interconnection line 109. A first spacer pattern SP1 may be interposed between the through vias BLTHV and the electrode layers EL and between the through vias BLTHV and the second substrate 201. The bit-line through vias BLTHV may be arranged in the first direction D1 and be formed in a zigzag pattern.

Referring to FIGS. 4A and 5, a second interlayer insulating layer 207 may be disposed on the first interlayer insulating layer 205. First conductive lines BLL and a second conductive line CSLL, extending in the second direction D2, may be disposed on the second interlayer insulating layer 207 in parallel with each other. The first conductive lines BLL may correspond to the bit lines BL0 to BL2 of FIG. 2. The second conductive line CSLL may be connected to the common source line CSL of FIG. 2. The first conductive lines BLL and the second conductive line CSLL may be covered with a third interlayer insulating layer 209.

Referring to FIGS. 4A and 5, the source contact plug CSLCT may be connected to the second conductive line CSLL through a first contact CT1 penetrating the second interlayer insulating layer 207. The second conductive line CSLL may not be connected to the bit-line through via BLTHV and the bit line pads 34.

Referring to FIGS. 4A and 6, second contacts CT2 may penetrate the first and second interlayer insulating layers 205 and 207 and to connect the bit line pads 34 disposed on the vertical semiconductor patterns VS with one of the first conductive lines BLL. The second contacts CT2 may not be provided on the bit line pad 34 disposed on the central dummy vertical pattern CDVS. A third contact CT3 may penetrate the second interlayer insulating layer 207 to connect the bit-line through via BLTHV to one of the first conductive lines BLL. Accordingly, the vertical semiconductor patterns VS may be connected to the first conductive lines BLL. The first conductive lines BLL may be electrically connected to the page buffer circuit of the peripheral logic structure PS through the bit-line through vias BLTHV.

Referring to FIGS. 3, 7, and 8, the electrode layers EL and the electrode interlayer insulating layers 12, which are included in each of the blocks BLKr and BLKd1 and BLKd3, may have a stair-stepped shape on the connection region CNR. For example, the less the distance to the peripheral logic structure PS, the greater the lengths or protruding lengths in the second direction D2 of the electrode layers EL and the electrode interlayer insulating layers 12. The stair-stepped end portions of the electrode layers EL and the electrode interlayer insulating layers 12 may be covered with an insulating planarization layer 220. The insulating planarization layer 220 may include a silicon oxide layer or a porous insulating layer. The first interlayer insulating layer 205 and the second interlayer insulating layer 207 may be sequentially stacked on the insulating planarization layer 220. End portions of the electrode layers EL may be connected to cell contact plugs CC, respectively. The cell contact plugs CC may be provided to penetrate the second interlayer insulating layer 207, the first interlayer insulating layer 205, and the electrode interlayer insulating layers 12 and to be in contact with the electrode layers EL, respectively.

Referring to FIG. 7, edge dummy vertical patterns EDVS may penetrate the insulating planarization layer 220 and the stair-stepped end portions of the electrode layers EL and the electrode interlayer insulating layers 12. The edge dummy vertical patterns EDVS may have an elliptical shape, which is elongated in a specific direction when viewed in a plan view. The edge dummy vertical patterns EDVS may have the same or similar cross-section as that of the vertical semiconductor pattern VS or the central dummy vertical pattern CDVS of FIG. 5 or 6. Internal spaces of the edge dummy vertical patterns EDVS may be filled with the insulating gapfill pattern 29. The gate insulating layer GO may be interposed between the edge dummy vertical patterns EDVS and the electrode layers EL.

Referring to FIG. 8, electrode connection lines CL may be disposed on the second interlayer insulating layer 207. Edge through vias ETHV may be provided on the connection region CNR to penetrate the first interlayer insulating layer 205, the insulating planarization layer 220, the second substrate 201, and the etch stop layer 111 and to electrically connect the electrode connection lines CL to the peripheral interconnection lines 109. The edge through vias ETHV may be connected to the electrode connection lines CL, respectively, through fourth contacts CT4 disposed in the second interlayer insulating layer 207. Accordingly, the electrode layers EL may be connected to a portion (e.g., a decoder circuit) of the logic structure PS. A second spacer pattern SP2 may be provided to surround a side surface of each of the edge through vias ETHV.

Referring to FIG. 8, an impurity injection region WR may be provided in a region of the second substrate 201 spaced apart from the edge through vias ETHV. The impurity injection region WR may be doped with impurities having the same conductivity type (e.g., the first conductivity type) as the second substrate 201 but have a doping concentration higher than that of the second substrate 201. A well contact plug WC may penetrate the first interlayer insulating layer 205 and the insulating planarization layer 220 to contact the impurity injection region WR. The electrode connection lines CL may be covered with the third interlayer insulating layer 209. An outer terminal CP may be disposed on the third interlayer insulating layer 209. A fifth contact CT5 may penetrate the third interlayer insulating layer 209 and the second interlayer insulating layer 207 to connect the outer terminal CP to the well contact plug WC. A side surface of the well contact plug WC may be covered with a third spacer pattern SP3.

In a 3D semiconductor memory device according to embodiments of the inventive concept (as viewed in plan), since the source contact plugs CSLCT (and not conductive lines) are disposed in the first and second word-line cut regions WCR1 and WCR2 and the first and second grooves G1 and G2, it is possible to suppress or prevent process failure(s), such as a short between the source contact plug CSLCT and the electrode layers EL. In addition, since the source contact plugs CSLCT are disposed between the dummy blocks BLKd1 to BLKd3 which are not used for actual operations, it may be possible to suppress the failure of the real blocks BLKr and prevent the source contact plugs CSLCT from affecting operations of the real blocks BLKr. This result improves the overall reliability of the semiconductor memory device. Furthermore, since the source contact plugs CSLCT serving as cell current paths are provided to electrically connect the source layer SCL to the second conductive line CSLL, it may be possible to improve a noise characteristics of the common source line CSL, as compared with structures including the first and second word-line cut regions WCR1 and WCR2 and the first and second grooves G1 and G2 filled with only an insulating layer, but without the source contact plug CSLCT. Thus, it may be possible to prevent data error(s) from occurring during read, write and erase operations. This result improves the overall reliability of the semiconductor memory device.

FIGS. 10A to 10J are related cross-sectional views illustrating in one example a method of fabricating the 3D semiconductor memory device of FIG. 5 according to embodiments of the inventive concept.

Figure 10A:
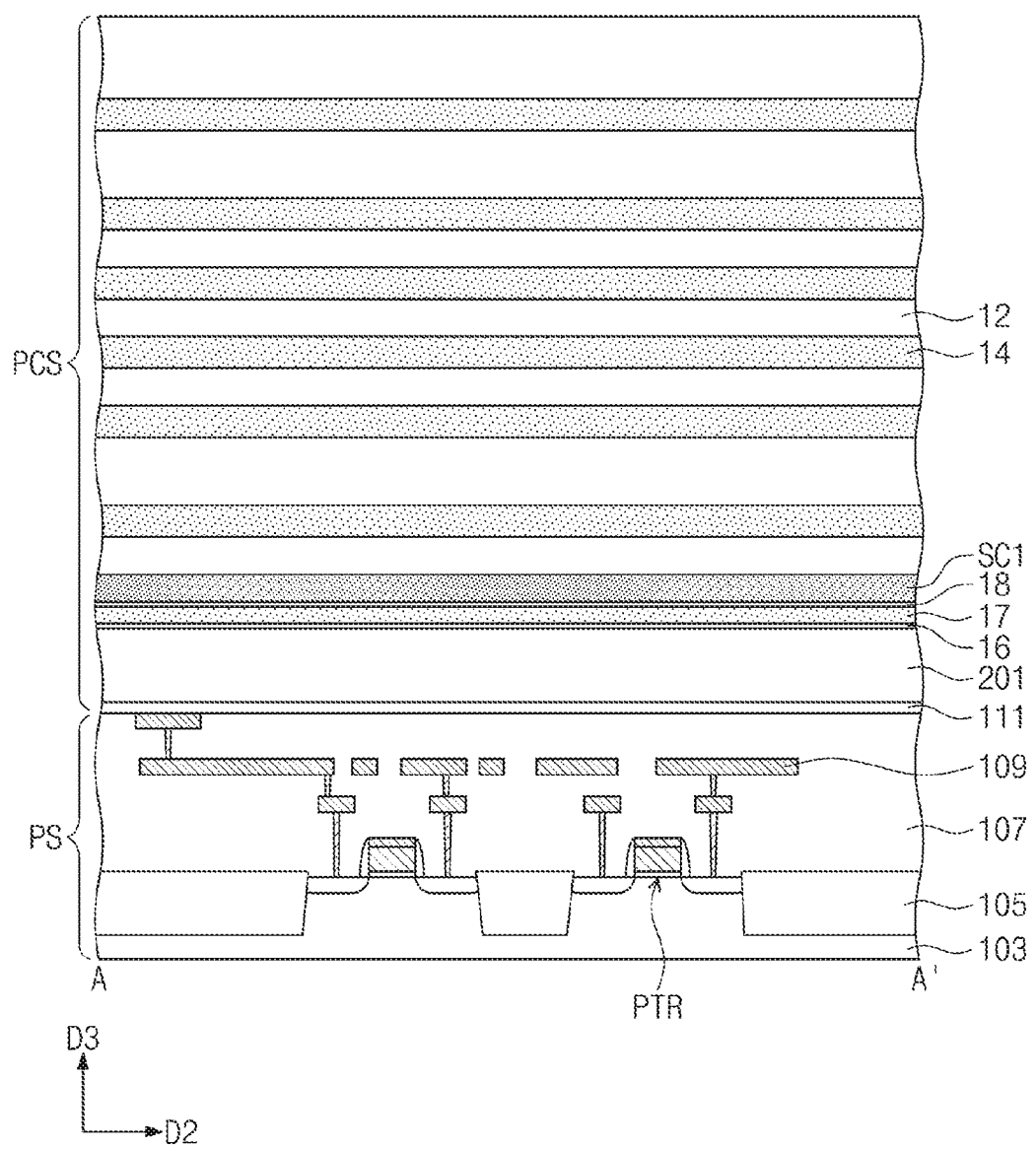
FIGS. 10A, 10B, 10C, 10D, 10E, 10F, 10G, 10H, 10I and 10J (collectively, FIGS. 10A to 10J) are related cross-sectional views illustrating in one example a method of fabricating the 3D semiconductor memory device of FIG. 5 according to embodiments of the inventive concept.

Referring to FIG. 10A, the peripheral logic structure PS is fabricated. To do this, the device isolation layer 105 may be formed in the first substrate 103 to delimit the active regions. The peripheral transistors PTR may be formed on the active regions. The peripheral interlayer insulating layer 107, which is composed of a plurality of layers, may be formed to cover the peripheral transistors PTR, and the peripheral interconnection lines 109 may be formed in the peripheral interlayer insulating layer 107. The etch stop layer 111 may be formed to cover the entire top surface of the peripheral interlayer insulating layer 107. The second substrate 201 may be formed on the etch stop layer 111. The second substrate 201 may be formed by forming an epitaxial semiconductor layer or by attaching a single crystalline semiconductor substrate to the etch stop layer 111. The second substrate 201 may be referred to as a semiconductor layer. The second substrate 201 may be doped with impurities of first conductivity type. An impurity injection region WR may be formed in the second substrate 201. Here, the impurity injection region WR may be formed by doping the second substrate 201 with impurities of first conductivity type, where the doping concentration is higher than that of the second substrate 201. A first buffer layer 16, a first sacrificial layer 17, a second buffer layer 18, and the first source pattern SC1 may be sequentially stacked on the second substrate 201. A preliminary cell array structure PCS may be formed by alternately and repeatedly stacking the electrode interlayer insulating layers 12 and second sacrificial layers 14 on the first source pattern SC1. The first source pattern SC1 may be a poly-silicon layer doped with impurities. In an embodiment, the first and second buffer layers 16 and 18 and the electrode interlayer insulating layers 12 may be formed of or include silicon oxide. The first sacrificial layer 17 may be formed from a material having an etch selectivity with respect to the first and second buffer layers 16 and 18, the electrode interlayer insulating layers 12, the first source pattern SC1, and the second sacrificial layers 14. For example, the second sacrificial layers 14 may be formed from silicon nitride. The first sacrificial layer 17 may be a silicon germanium layer or a silicon oxynitride layer. In an embodiment, the first sacrificial layer 17 may be a poly-silicon layer doped to have a different doping concentration than that of the first source pattern SC1.

Referring to FIGS. 10A and 8, a trimming process and an anisotropic etching process may be repeatedly performed to form end portions of the electrode interlayer insulating layers 12 and the second sacrificial layers 14 in the stair-stepped shape. Here, the first buffer layer 16, the first sacrificial layer 17, the second buffer layer 18, and the first source pattern SC1 may be partially etched to expose a top surface of the second substrate 201. The insulating planarization layer 220 may be formed to cover the end portions of the electrode interlayer insulating layers 12 and the second sacrificial layers 14, and then, a chemical mechanical polishing (CMP) process may be performed on the insulating planarization layer 220.

Figure 10B:
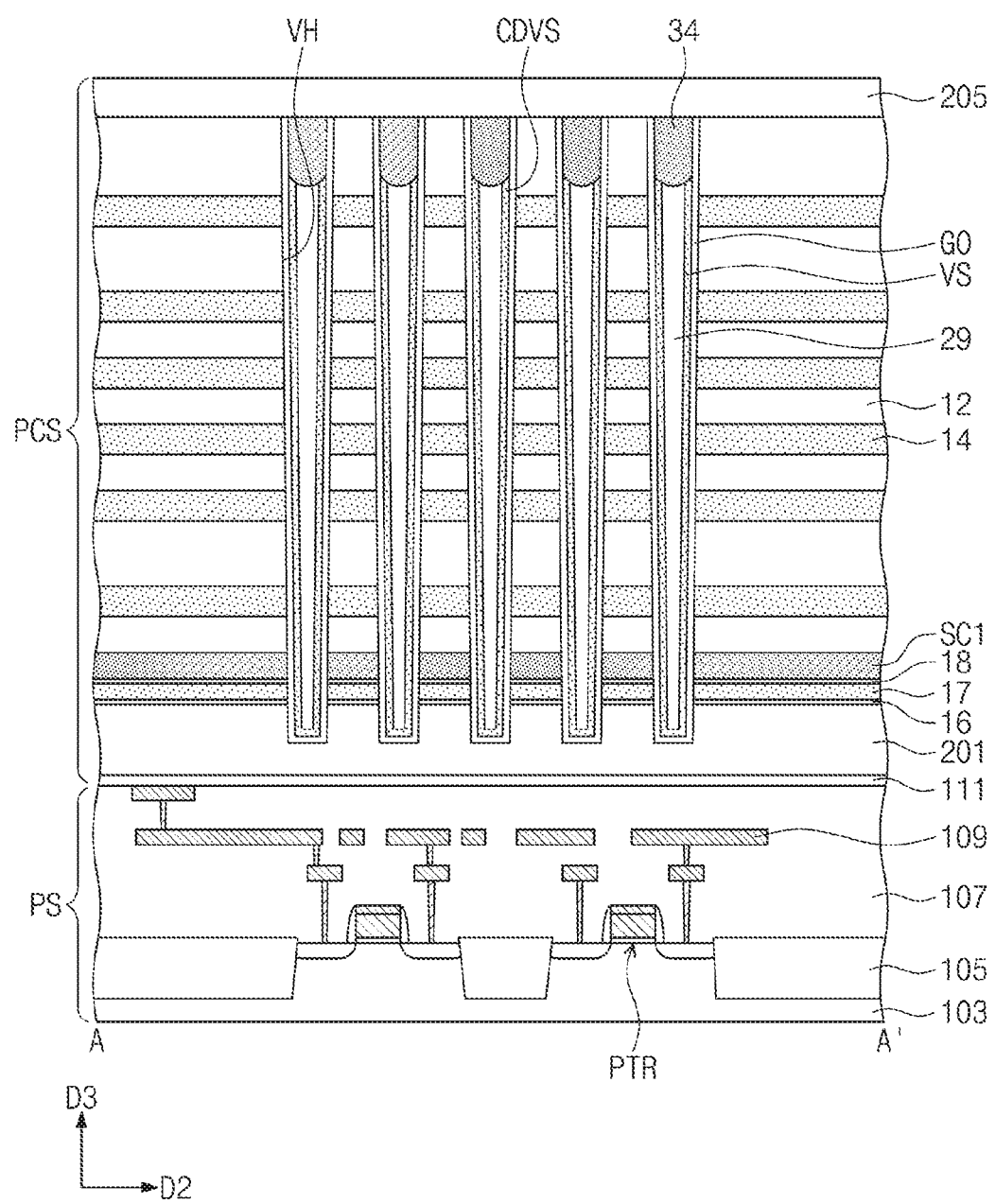

Referring to FIGS. 4 and 10B, the topmost layer of the electrode interlayer insulating layers 12 and the second sacrificial layer 14 may be partially removed to form a recess region extending in the first direction D1. Then, the central separation pattern 9 may be formed by filling the recess region with an insulating layer. Vertical holes VH may be formed by patterning the electrode interlayer insulating layers 12, the second sacrificial layers 14, the first source pattern SC1, the second buffer layer 18, the first sacrificial layer 17, the first buffer layer 16, and a portion of the second substrate 201. The vertical holes VH may be formed on not only the cell array region CAR, but also the connection region CNR. The gate insulating layer GO may be formed to conformally cover side surfaces of the vertical holes VH. On the cell array region CAR, the vertical semiconductor pattern VS and the central dummy vertical pattern CDVS may be formed on the gate insulating layer GO in the vertical holes VH. On the connection region CNR, the edge dummy vertical pattern EDVS may be formed on the gate insulating layer GO in the vertical holes VH. The insulating gapfill pattern 29 may be formed to fill the vertical holes VH. The bit line pads 34 may be formed by partially removing the insulating gapfill pattern 29 and upper portions of the vertical semiconductor pattern VS, the central dummy vertical pattern CDVS, and the edge dummy vertical pattern EDVS and filling the removed regions with a conductive layer. The first interlayer insulating layer 205 may be formed on the topmost layer of the electrode interlayer insulating layers 12.

Figure 10C:
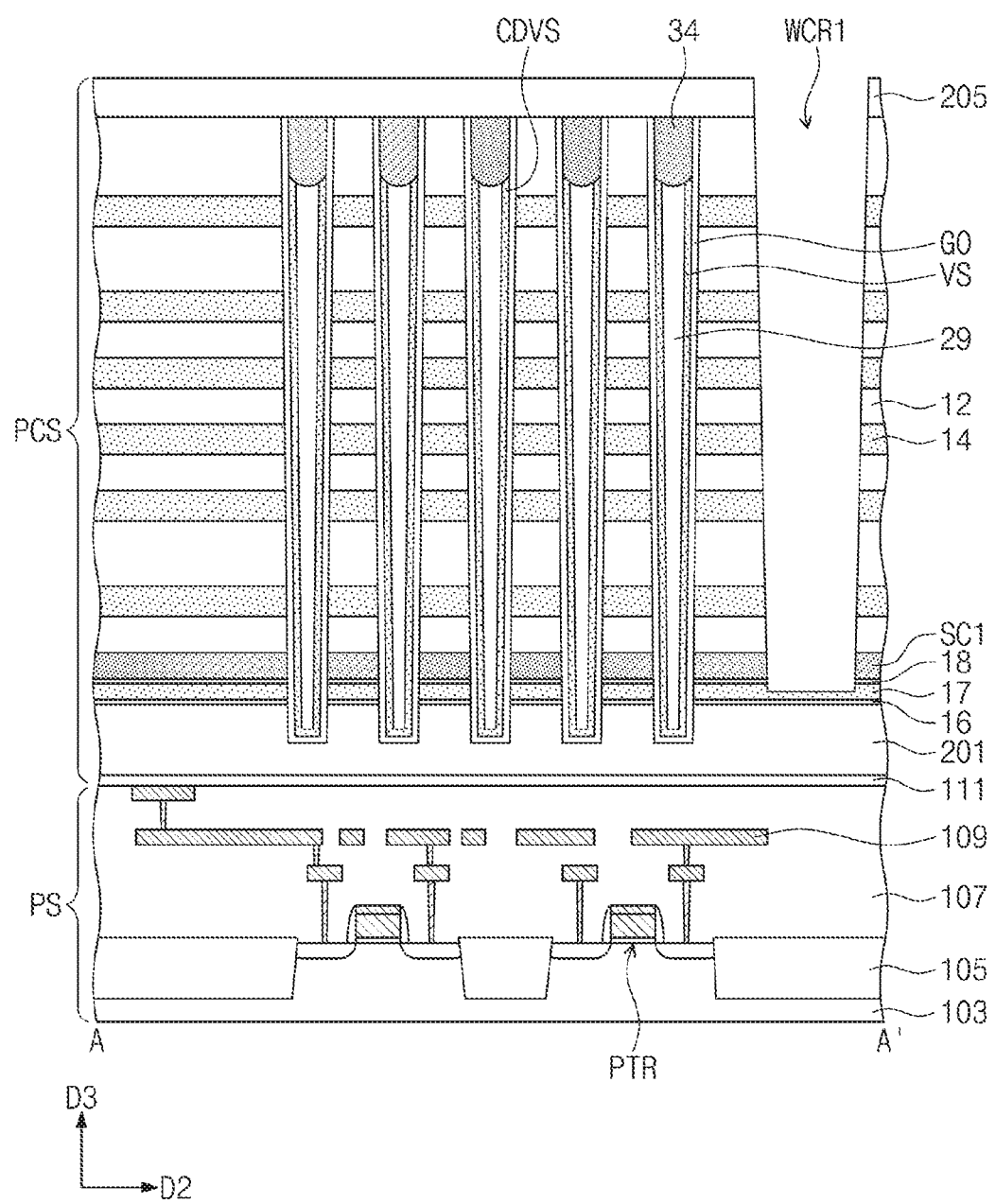

Referring to FIGS. 3, 4A, and 10C, the first interlayer insulating layer 205, the electrode interlayer insulating layers 12, the second sacrificial layers 14, the first source pattern SC1, and the second buffer layer 18 may be sequentially patterned to form the first and second word-line cut regions WCR1 and WCR2 exposing the first sacrificial layer 17. The first and second grooves G1 and G2 may be formed concurrently when the first and second word-line cut regions WCR1 and WCR2 are formed. The first and second word-line cut regions WCR1 and WCR2 may have the same planar shapes as the first and second insulating separation patterns SL1 and SL2, respectively. For example, the first word-line cut region WCR1, which is located between the dummy blocks BLKd1 to BLKd3, may have the first width W1 and the second width W2, which are different from each other, according to position in the first direction D1. The second word-line cut region WCR2 adjacent to the real blocks BLKr may have the third width W3 which is constant regardless of position in the first direction D1.

Figure 10D:
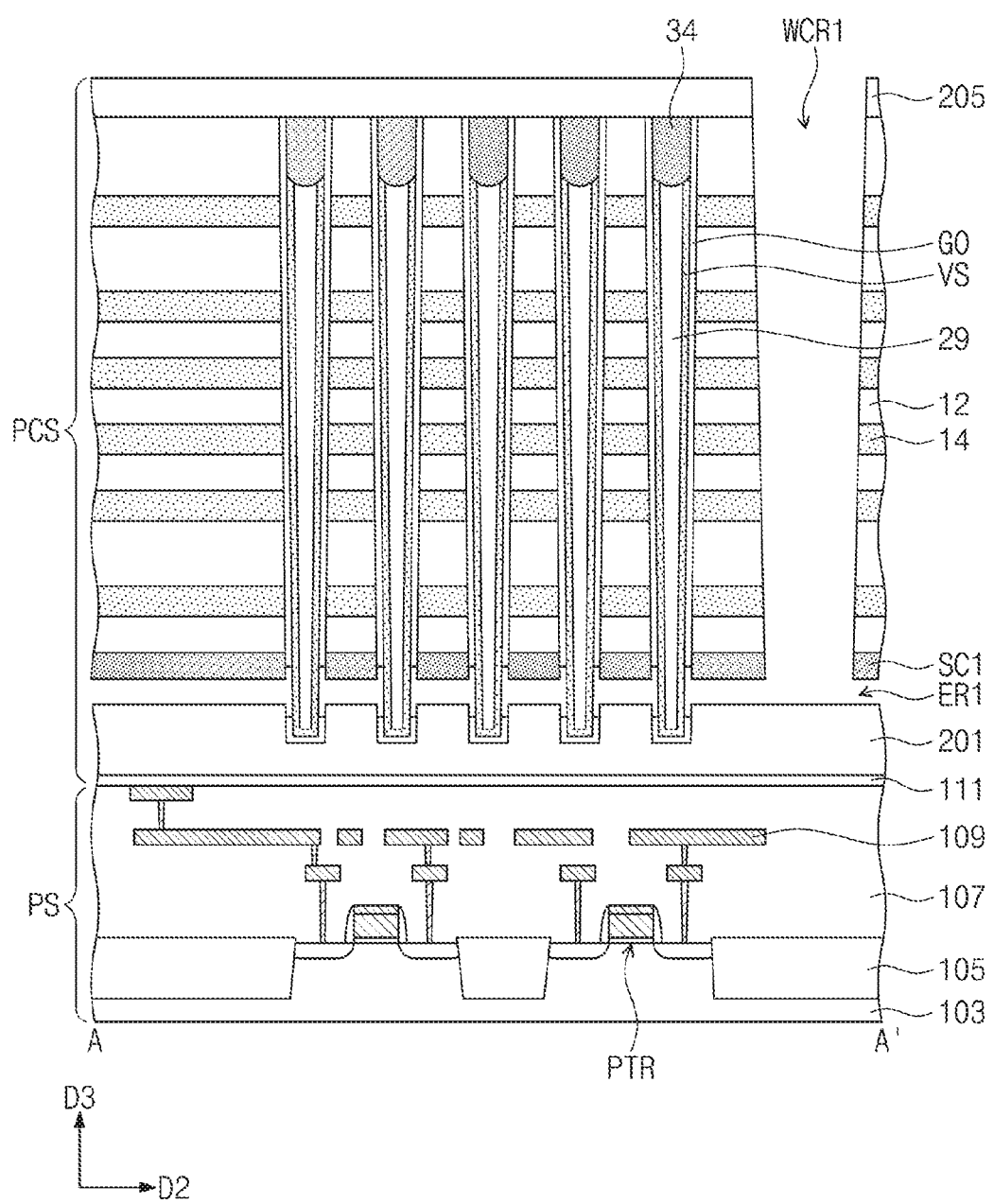

Referring to FIG. 10D, a first empty region ER1 may be formed by an isotropic etching process of removing the second buffer layer 18, the first sacrificial layer 17, and the first buffer layer 16 through the first and second word-line cut regions WCR1 and WCR2 and the first and second grooves G1 and G2. Here, a portion of the gate insulating layer GO may be removed to expose side surfaces of the vertical semiconductor pattern VS, the central dummy vertical pattern CDVS, and the edge dummy vertical pattern EDVS. The first empty region ER1 may be formed to expose a bottom surface of the first source pattern SC1 and a top surface of the second substrate 201. The vertical semiconductor pattern VS, the central dummy vertical pattern CDVS, and the edge dummy vertical pattern EDVS may serve as supporters preventing the preliminary cell array structure PCS from leaning or collapsing when the first empty region ER1 is formed.

Figure 10E:
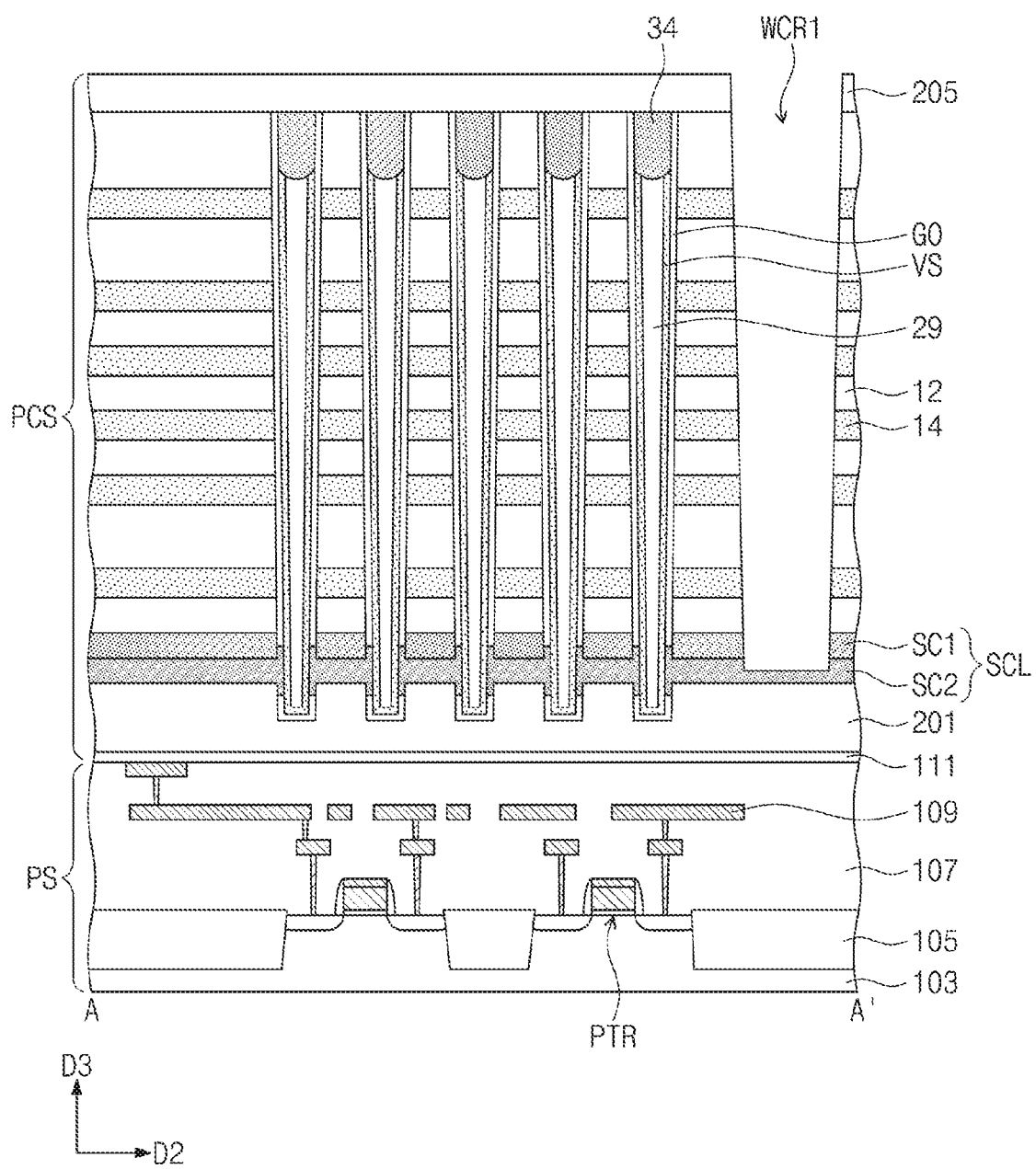

Referring to FIGS. 10D and 10E, a second source layer may be (e.g.,) conformally, deposited to fill the first and second word-line cut regions WCR1 and WCR2, the first and second grooves G1 and G2, and the first empty region ER1. Then, an anisotropic etching process may be performed to remove the second source layer from the first and second word-line cut regions WCR1 and WCR2 and the first and second grooves G1 and G2 and to leave the second source layer in the first empty region ER1. Thus, the second source pattern SC2, which is the remaining portion of the second source layer, may be formed in the first empty region ER1. Accordingly, the first source pattern SC1 and the second source pattern SC2 may constitute the source layer SCL.

Figure 10F:
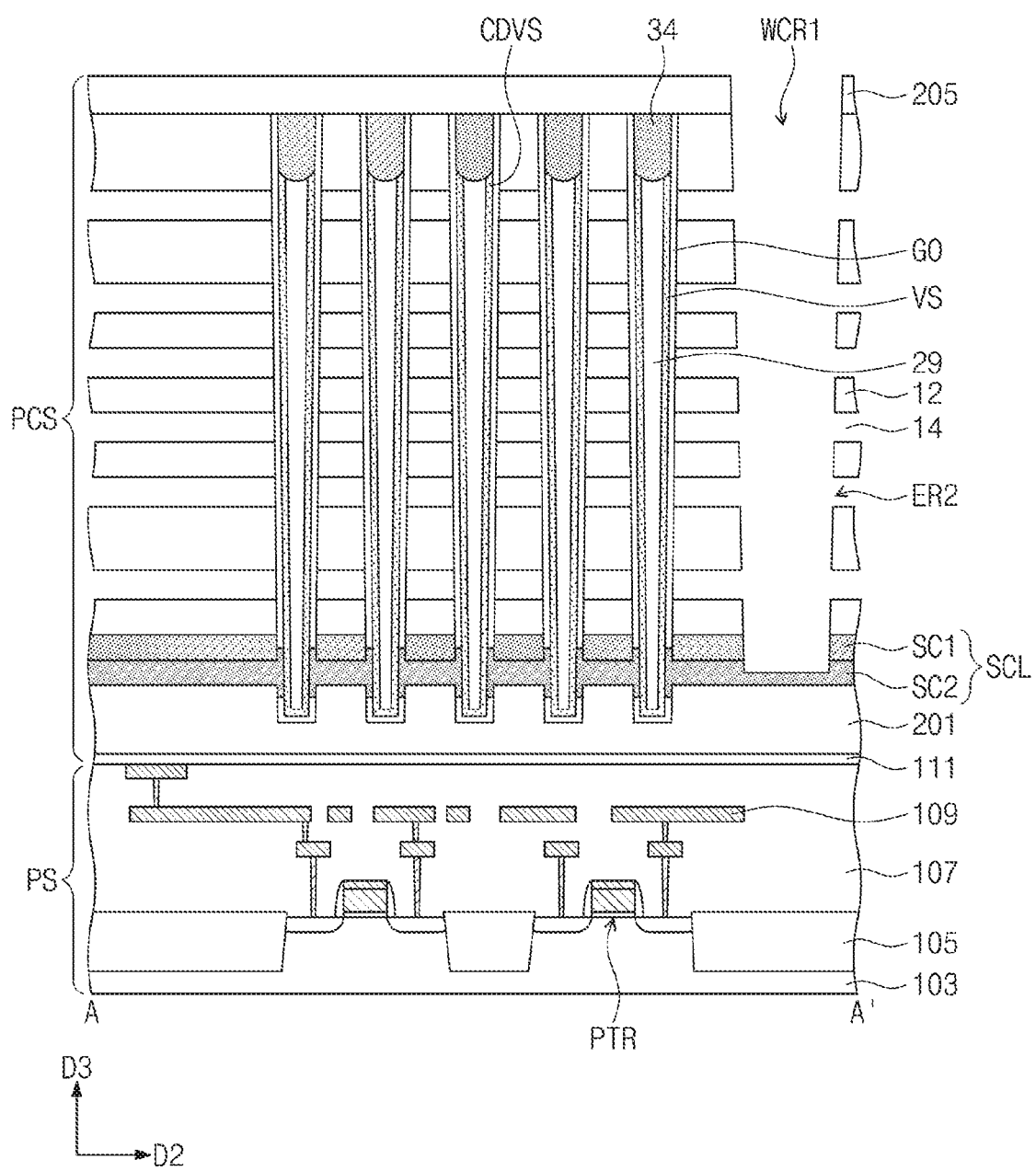

Referring to FIG. 10F, second empty spaces ER2 may be formed between the electrode interlayer insulating layers 12 by removing the second sacrificial layers 14 through the first and second word-line cut regions WCR1 and WCR2 and the first and second grooves G1 and G2. Each of the second empty spaces ER2 may be formed to expose a portion of the side surface of the gate insulating layer GO.

Figure 10G:
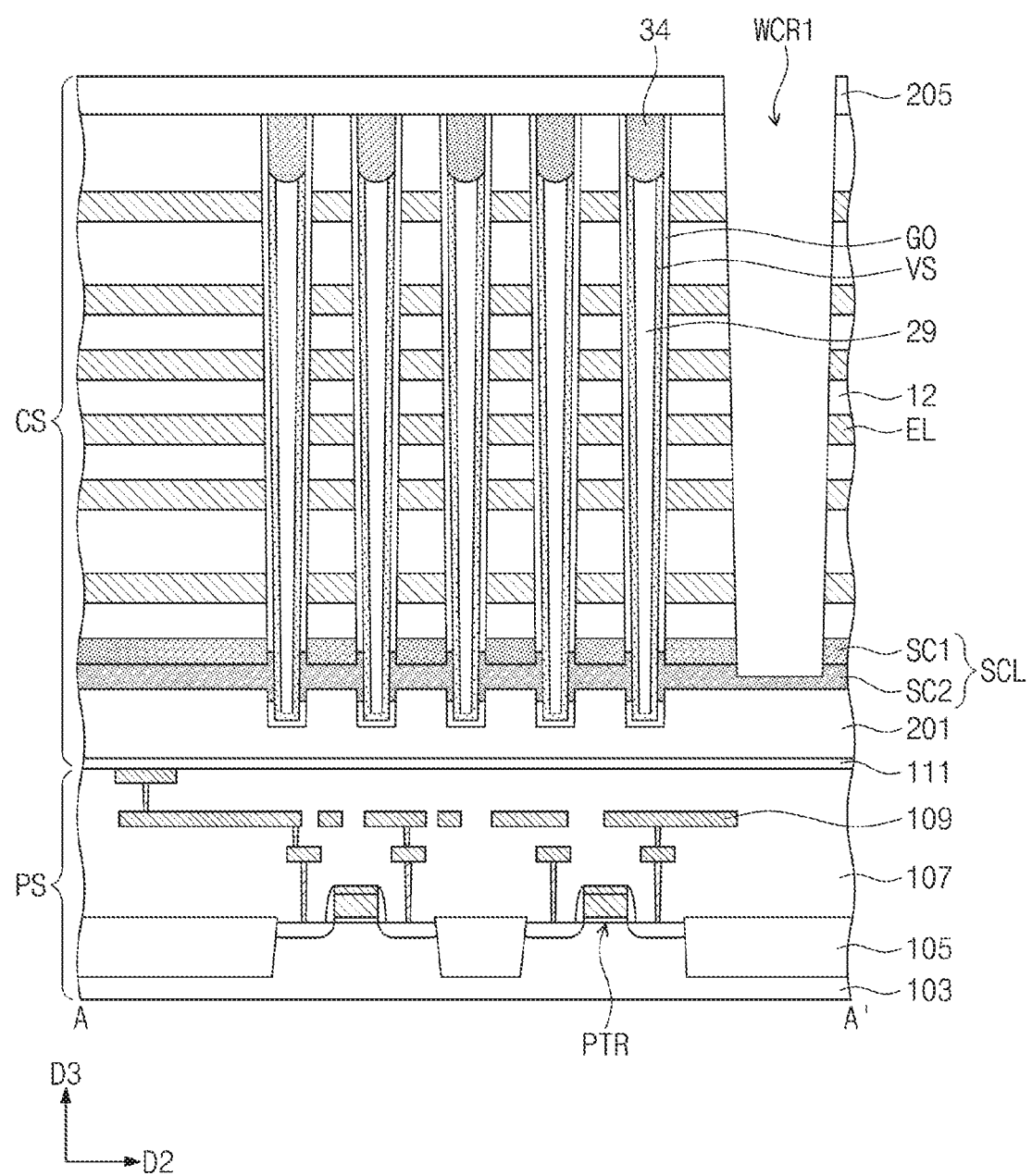

Referring to FIGS. 10F and 10G, the second empty spaces ER2 may be filled with a conductive layer which is (e.g.,) conformally deposited through the first and second word-line cut regions WCR1 and WCR2 and the first and second grooves G1 and G2. Thereafter, an anisotropic etching process may be performed to remove the conductive layer from the first and second word-line cut regions WCR1 and WCR2 and the first and second grooves G1 and G2 and to leave the electrode layers EL in the second empty spaces ER2. The high-k dielectric layer HL of FIG. 9 may be conformally formed before stacking the conductive layer. Accordingly, the blocks BLKr and BLKd1 to BLKd3 of the cell array structure CS may be formed.

Figure 10H:
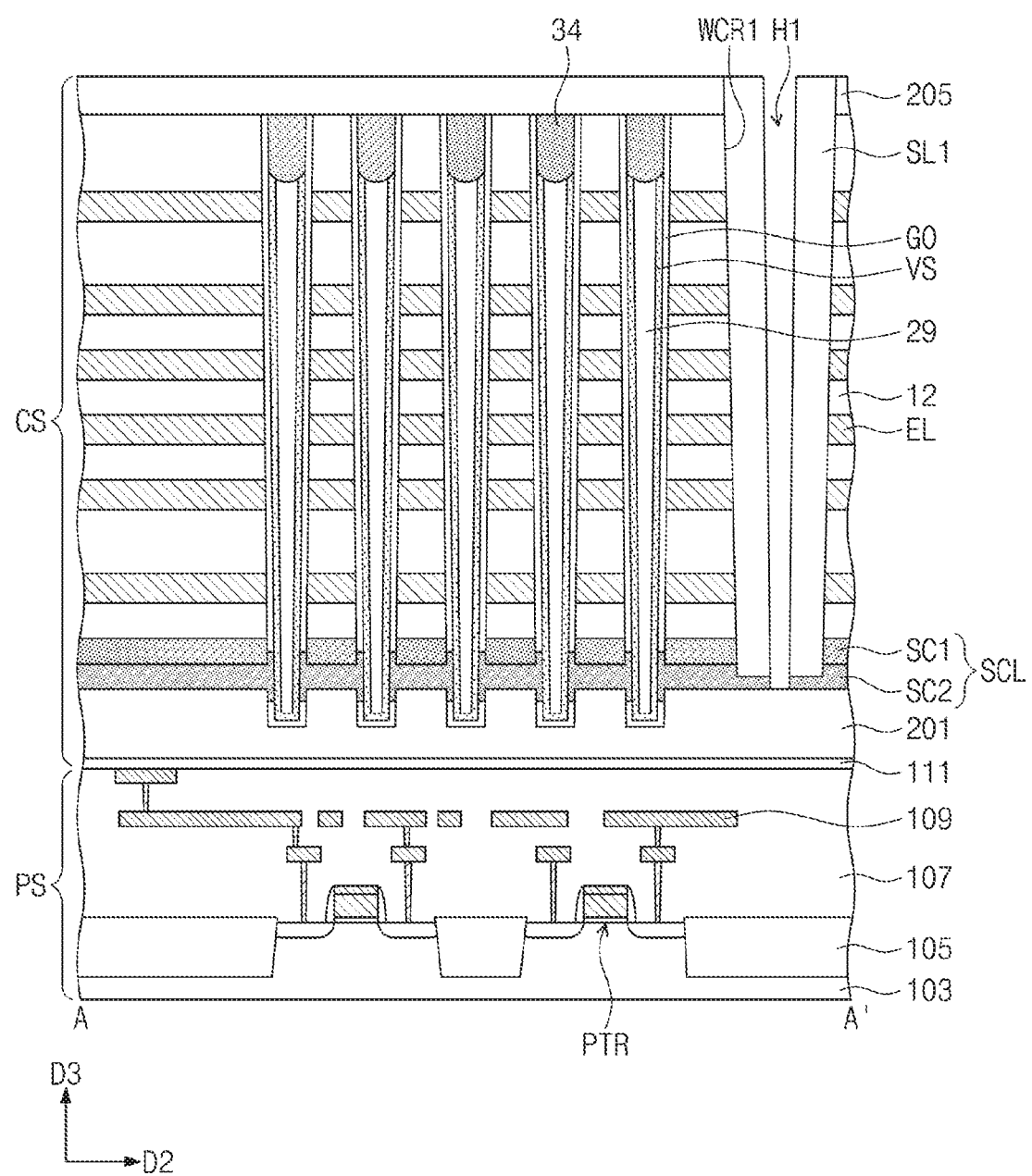

Referring to FIGS. 4A and 10H, the first to third insulating separation patterns SL1, SL2, and SL3 may be formed by conformally depositing an insulating layer to fill the first and second word-line cut regions WCR1 and WCR2 and the first and second grooves G1 and G2. Thereafter, a source contact hole H1 exposing the second source pattern SC2 or the second substrate 201 may be formed by removing a portion of the first insulating separation pattern SL1, which has the first width W1, using an additional mask. Alternatively, the insulating layer may be conformally formed to fill the first word-line cut region WCR1 of the second width W2 or the second word-line cut region WCR2 of the third width W3, but not to fill the first word-line cut region WCR1 having the first width W1 which is greater than the second and third widths W2 and W3. Then, an anisotropic etching process may be performed on the insulating layer. In this case, the first insulating separation pattern SL1 may be formed to fill the first word-line cut region WCR1 of the second width W2 and to cover a side surface of the first word-line cut region WCR1 of the first width W1, and concurrently, the source contact hole H1 may be formed in a self-aligned manner. Furthermore, the second and third insulating separation patterns SL2 and SL3 may be formed concurrently during the formation of the first insulating separation pattern SL1. In an embodiment, a plurality of the source contact holes H1 may be formed to form a single column parallel to the first direction D1.

Figure 10I:
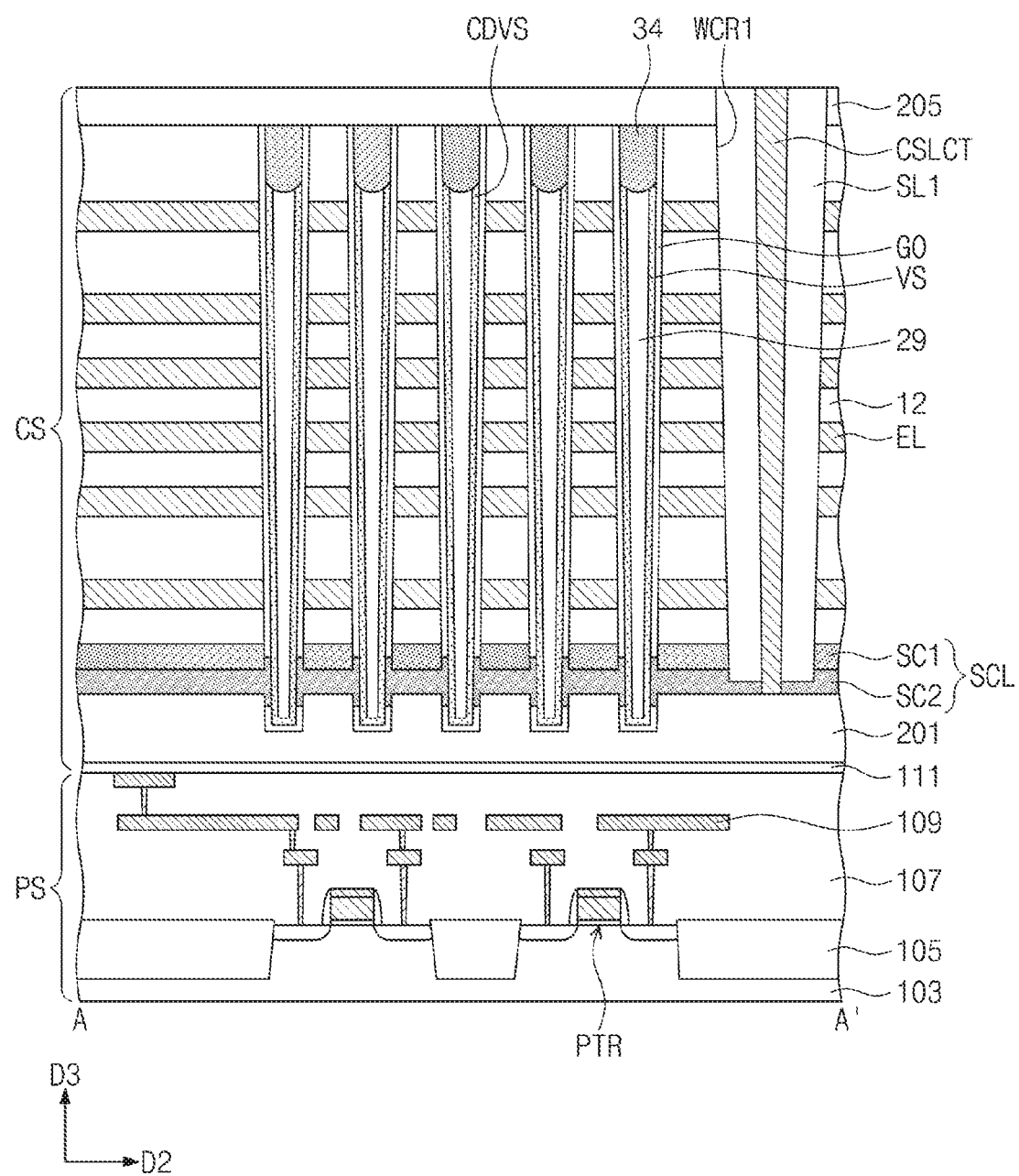

Referring to FIGS. 3 and 10I, a conductive layer may be deposited to fill the source contact hole H1. Then, an etch-back process may be performed to remove the conductive layer from the top surface of the first interlayer insulating layer 205 and to form the source contact plug CSLCT in the source contact hole H1. The source contact plug CSLCT has a bottom surface that may be disposed lower than a bottom surface of the first insulating separation pattern SL1, and may contact the second source pattern SC2.

Figure 10J:
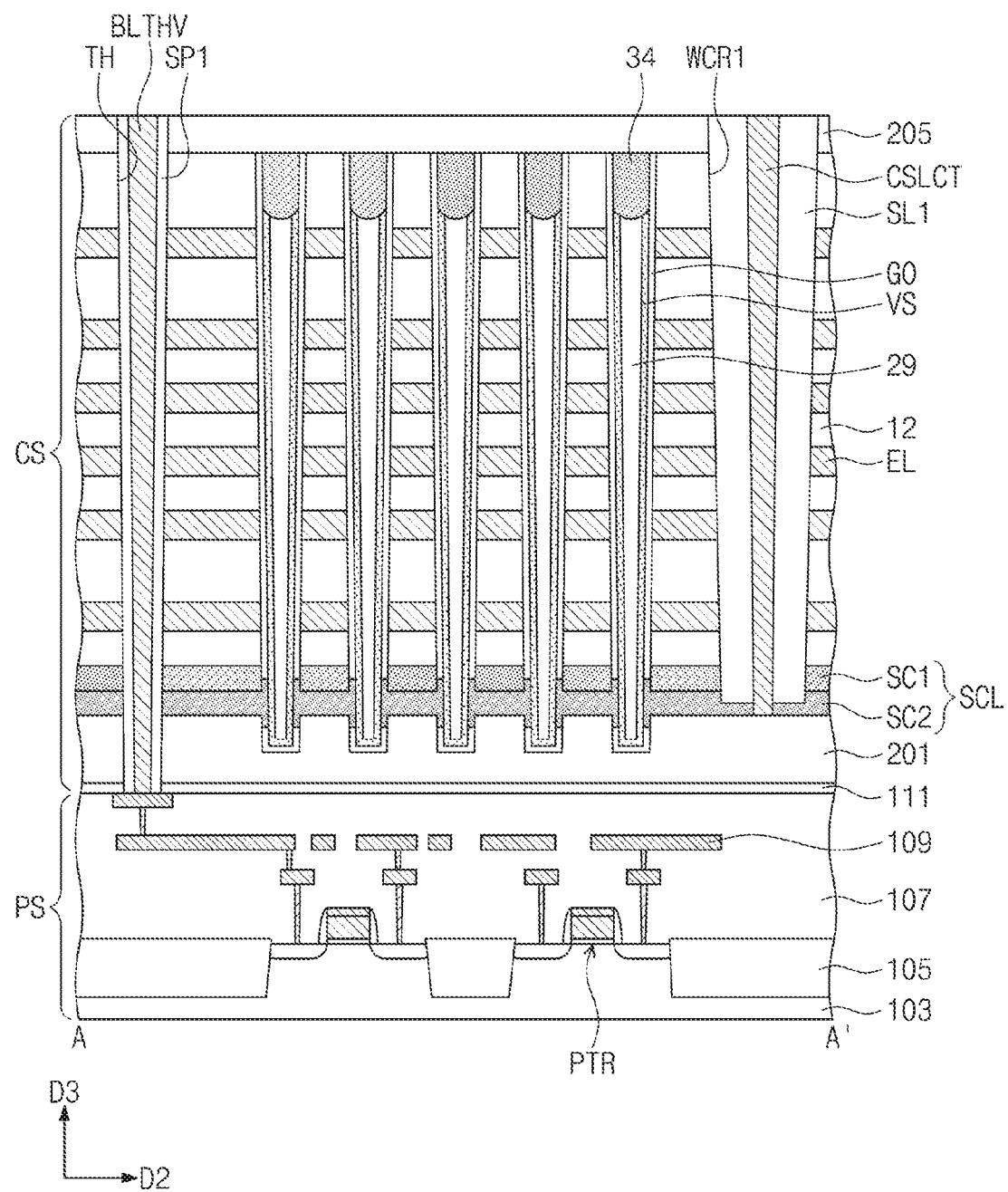

Referring to FIGS. 10J and 8, a bit-line through-hole TH exposing one of the peripheral interconnection lines 109 may be formed by etching the first interlayer insulating layer 205, the electrode interlayer insulating layers 12, the electrode layers EL, the source layer SCL, the second substrate 201, and the etch stop layer 111 in the through-via region THVR of the second dummy block BLKd2. Thereafter, the first spacer pattern SP1 may be formed to cover a side surface of the bit-line through-hole TH, and the bit-line through via BLTHV may be formed to fill the bit-line through-hole TH provided with the first spacer pattern SP1. The second spacer pattern SP2 and the edge through via ETHV of FIG. 8 may be formed concurrently when the first spacer pattern SP1 and the bit-line through via BLTHV are formed. In addition, the third spacer pattern SP3 and the well contact plug WC of FIG. 8 may also be formed concurrently during this process.

Thereafter, the second interlayer insulating layer 207, the cell contact plugs CC, the first to fifth contacts CT1 to CT5, the first conductive lines BLL, the second conductive line CSLL, the electrode connection lines CL, the third interlayer insulating layer 209, and the outer terminal CP may be formed in the same or similar manner as that described with reference to FIGS. 5, 6, and 8.

Figure 11:
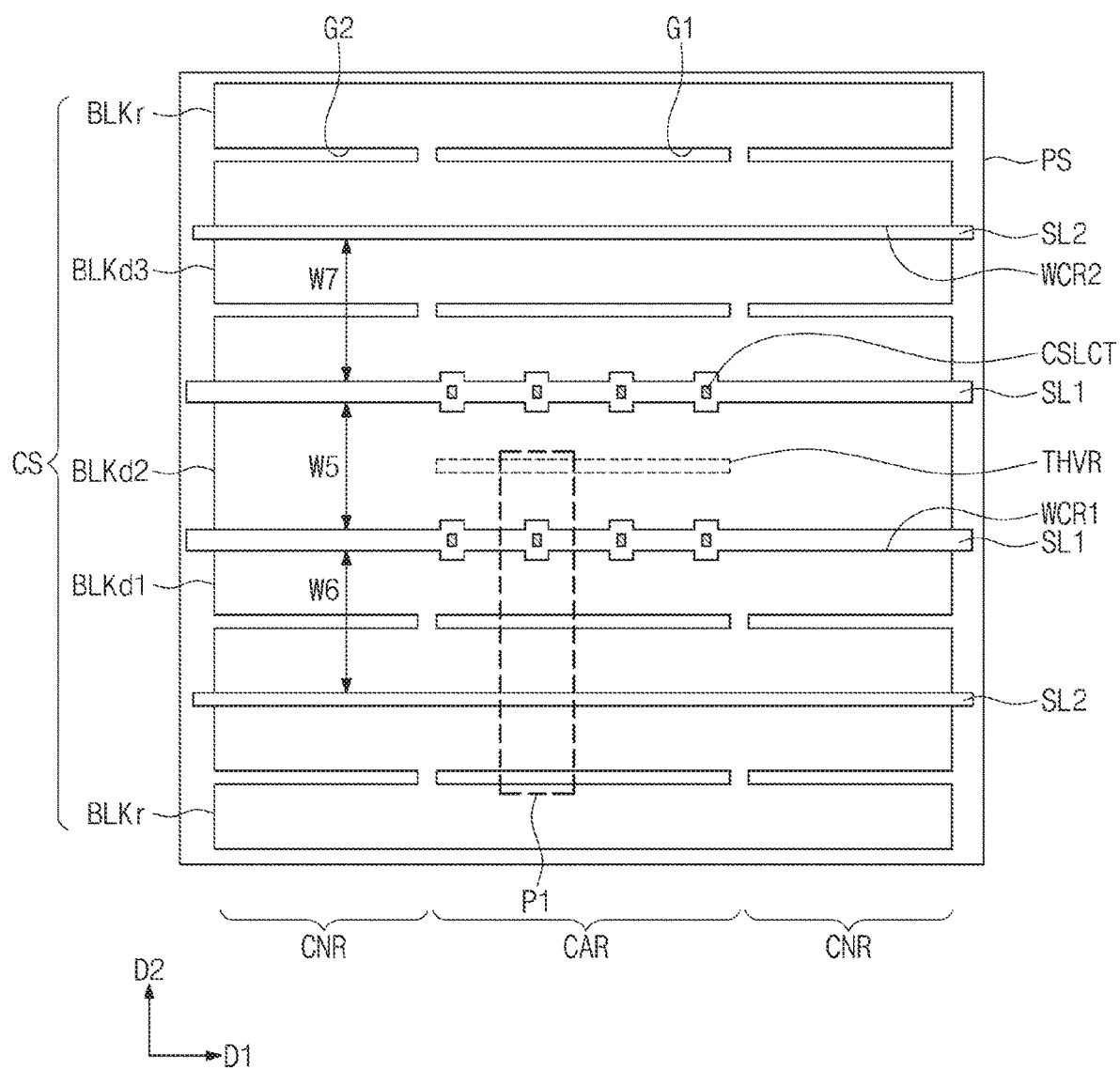
FIG. 11 is a plan view illustrating a 3D semiconductor memory device according to embodiments of the inventive concept.
Figure 12:
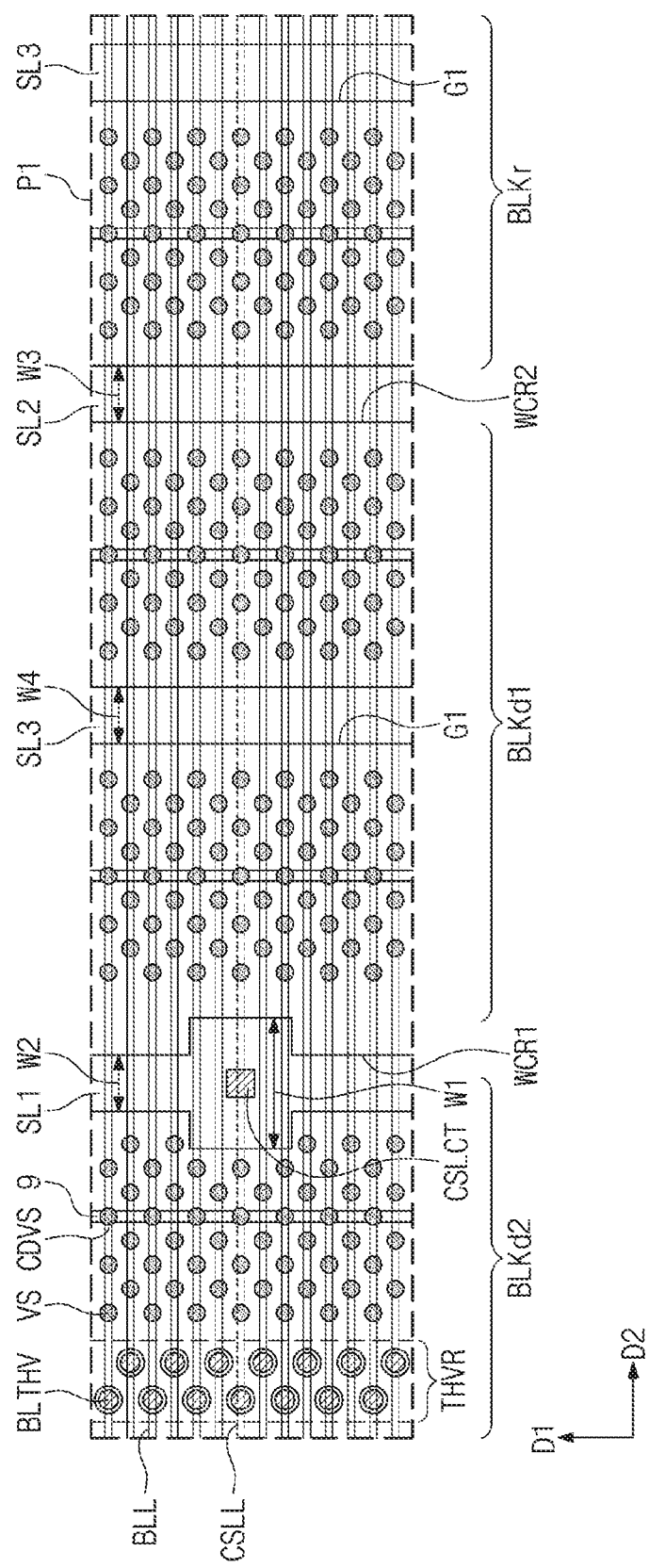
FIG. 12 is a plan view further illustrating the portion 'P1' of FIG. 11.

FIG. 11 is a plan view illustrating a 3D semiconductor memory device according to embodiments of the inventive concept, and FIG. 12 is a plan view further illustrating the portion T1' of FIG. 11.

Referring to FIGS. 11 and 12, the first insulating separation pattern SL1 may have two different widths (e.g., the first width W1 and the second width W2) as measured in the second direction D2. That is, the first width W1 may be greater than the second width W2. The source contact plug CSLCT may be disposed in a portion of the first insulating separation pattern SL1 having the second width W1. The second insulating separation pattern SL2 may have the third width W3 as measured in the second direction D2. The third insulating separation pattern SL3 may have the fourth width W4 as measured in the second direction D2. Here, the third width W3 may be substantially the same as the fourth width W4, and the first width W1 and the second width W2 may be greater than the third width W3 and/or the fourth width W4. Thus, it is possible to secure sufficient space for the source contact plug CSLCT. Accordingly, short circuit(s) may be prevented from forming between the source contact plug CSLCT and the electrode layers EL.

Referring to FIG. 11, the second dummy block BLKd2 may have a fifth width W5 as measured in the second direction D2. The first dummy block BLKd1, adjacent to a side portion of the second dummy block BLKd2, may have a sixth width W6 as measured in the second direction D2. The third dummy block BLKd3, adjacent to an opposite portion of the second dummy block BLKd2, may have a seventh width W7 as measured in the second direction D2. Here, the sixth width W6 may be substantially the same as the seventh width W7, and the fifth width W5 may be less than the sixth width W6 and/or the seventh width W7.

Referring to FIGS. 11 and 12, due to this relationship between the first to seventh widths W1 to W7, a number of the vertical semiconductor patterns VS disposed in the second dummy block BLKd2 may be less than a number of the vertical semiconductor patterns VS disposed in each of the first and third dummy blocks BLKd1 and BLKd3 and the real block BLKr. For example, the number of the vertical semiconductor patterns VS disposed between the through-via region THVR and the first insulating separation pattern SL1 and overlapped by the second conductive line CSLL may be three (3), as shown in FIG. 12. However, the number of the vertical semiconductor patterns VS disposed between the first insulating separation pattern SL1 and the third insulating separation pattern SL3 and overlapped by the second conductive line CSLL may be four (4). Otherwise, the structure may be the same as or similar to that described with reference to FIGS. 3 to 9. According to certain embodiments of the inventive concept, by adjusting the first to seventh widths W1 to W7, it is possible to secure sufficient space for the source contact plug CSLCT without fear of creating a process failure.

Figure 13:
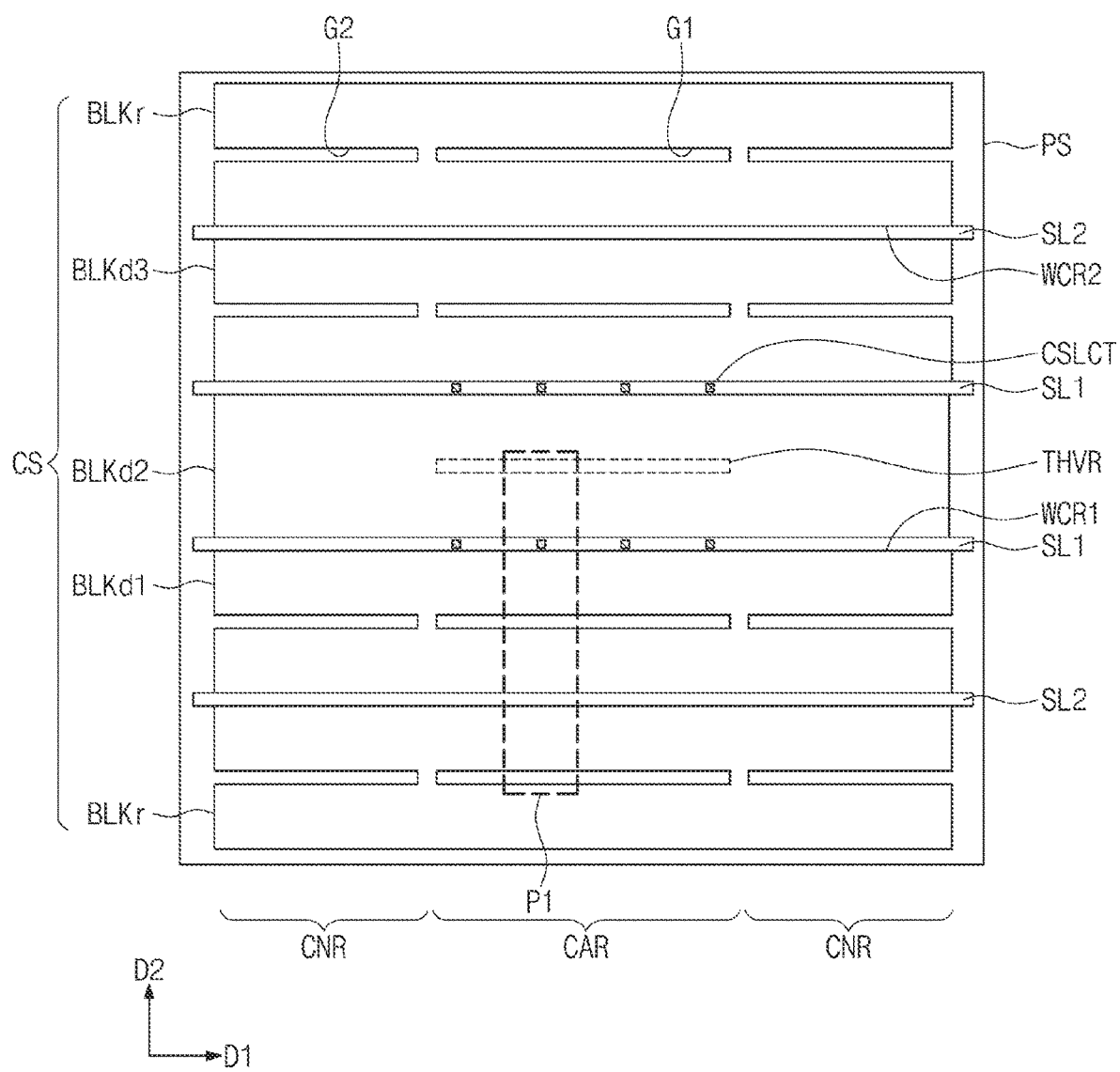
FIG. 13 is a plan view illustrating a 3D semiconductor memory device according to embodiments of the inventive concept.
Figure 14:
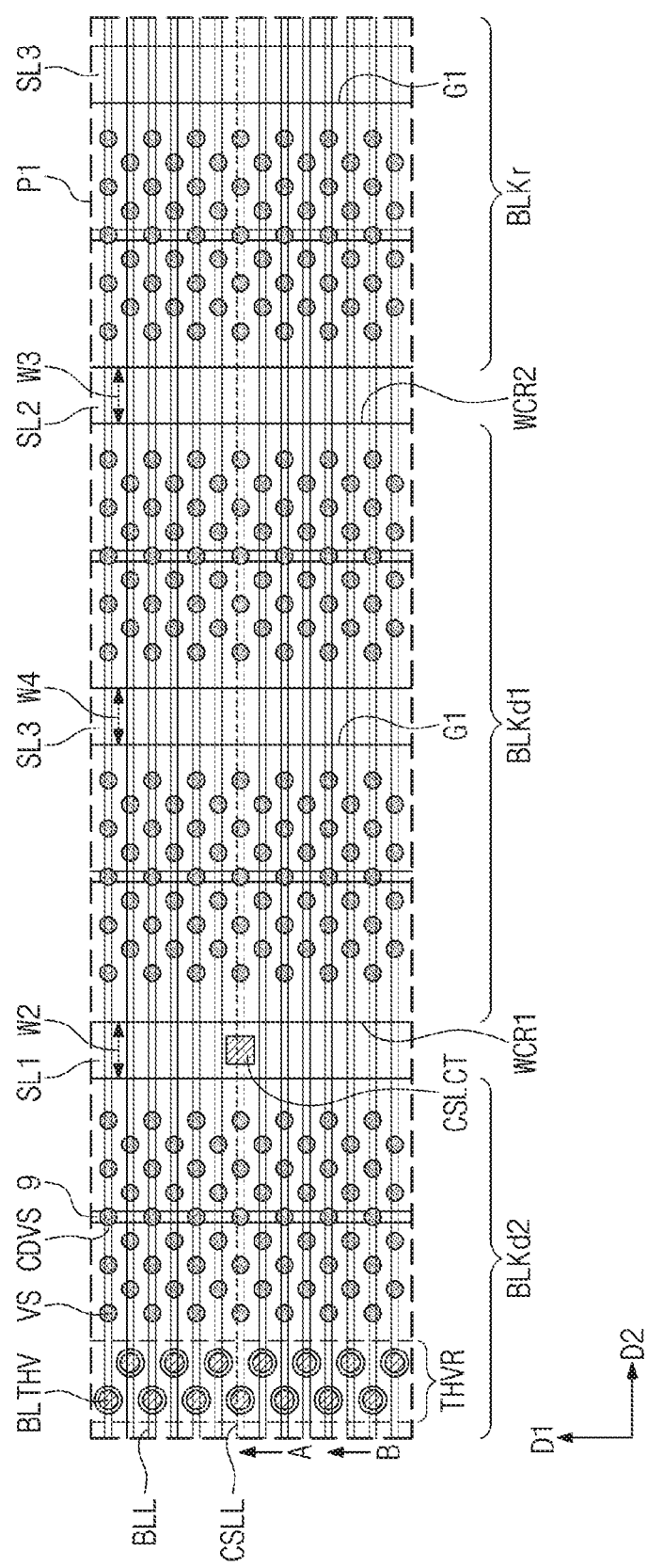
FIG. 14 is a plan view further illustrating the portion 'P1' of FIG. 13.

FIG. 13 is a plan view illustrating a 3D semiconductor memory device according to embodiments of the inventive concept, and FIG. 14 is a plan view further illustrating the portion 'P1' of FIG. 13.

Referring to FIGS. 13 and 14, the first insulating separation pattern SL1 may have a uniform width (e.g., the second width W2) regardless of position. The spaced apart source contact plugs CSLCT may be disposed in the first insulating separation pattern SL1. The second insulating separation pattern SL2 may have the third width W3 as measured in the second direction D2. The third insulating separation pattern SL3 may have the fourth width W4 as measured in the second direction D2. Here, the second width W2, the third width W3, and the fourth width W4 may be substantially the same. Otherwise, the structure may be the same as or similar to that described with reference to FIGS. 3 to 9.

Figure 15:
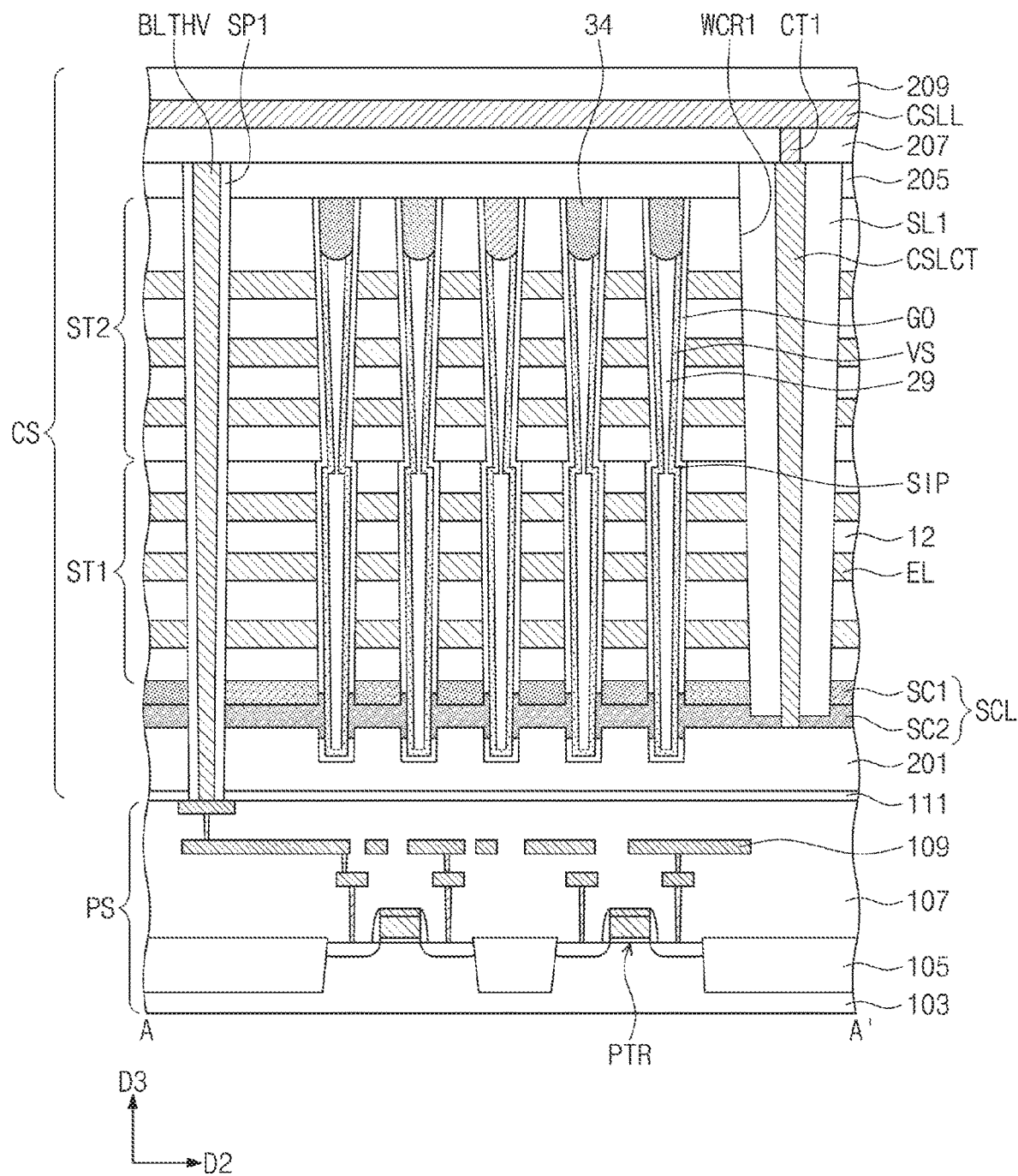
FIG. 15 is a cross-sectional view taken along the line A-A' of FIG. 4A.

FIG. 15 is a cross-sectional view taken along the line A-A' of FIG. 4A.

Referring to FIG. 15, the cell array structure CS may include a first stack structure ST1 and a second stack structure ST2 sequentially stacked on the source layer SCL. Each of the first and second stack structures ST1 and ST2 may include alternately stacked electrode layers EL and electrode interlayer insulating layers 12. The side surfaces of the vertical patterns VS, CDVS, and EDVS may have an inflection point SIP near a boundary between the first and second stack structures ST1 and ST2. In addition, the side surface of the gate insulating layer GO may also have an inflection point near the boundary between the first and second stack structures ST1 and ST2. Otherwise, the structure may be the same as or similar to that described with reference to FIG. 5.

When viewing a 3D semiconductor memory device according to embodiments of the inventive concept in plan, a source contact may be provided in the form of a conductive plug, and not as a conductive line. Thus, it is possible to suppress or prevent process failure(s) such as shorts between the source contact and electrode layers. In addition, since the source contact plugs are disposed between dummy blocks which are not used for actual operations, it may be possible to suppress operational failure(s) in real blocks, thereby improving the overall reliability of the semiconductor memory device. Furthermore, since the source contact plugs provide an additional cell current path, it may be possible to improve noise characteristics of the common source line, as compared with structures filled with only an insulating layer and lacking the source contact plugs. Accordingly, it may be possible to improve the overall reliability of the semiconductor memory device.

While example embodiments of the inventive concept have been particularly shown and described, it will be understood by one of ordinary skill in the art that variations in form and detail may be made therein without departing from the spirit and scope of the attached claims.

What is claimed is:

1. A three-dimensional semiconductor memory device, comprising:
a first block and a second block arranged on a first substrate in a first direction, wherein each of the first block and the second block includes electrode layers stacked on the first substrate;
a source layer interposed between the first block and the first substrate, and between the second block and the first substrate;
a first insulating separation pattern interposed between the first block and the second block and extending in the first direction, wherein the first insulating separation pattern includes a line portion and a protruding portion, the line portion extending in a second direction crossing the first direction, and the protruding portion having a width greater than a width of the line portion;
a first source contact plug penetrating the protruding portion of the first insulating separation pattern to electrically connect the source layer;
a plurality of first conductive lines crossing over the first block, the first insulating separation pattern and the second block in the second direction;
at least one through via penetrating the source layer and at least one of the first block and the second block to be connected to one of the plurality of first conductive lines,
wherein the source layer includes a first source pattern and a second source pattern which are sequentially stacked, and
wherein the at least one through via penetrates the first source pattern and the second source pattern.

2. The device of claim 1, wherein the through via comprises a plurality of through vias arranged in the second direction to form a zigzag pattern.

3. The device of claim 1, further comprising:
a peripheral logic structure disposed below the first substrate,
wherein the through via further penetrates the first substrate to connect one of the first conductive lines to the peripheral logic structure.

4. The device of claim 3, further comprising:
a plurality of vertical semiconductor patterns penetrating at least one of the first block and the second block between the through via and the first insulating separation pattern.

5. The device of claim 4, wherein the plurality of vertical semiconductor patterns include a first vertical semiconductor pattern and a second vertical semiconductor pattern, wherein the first vertical semiconductor pattern is closest to the protruding portion and the second vertical semiconductor pattern is closest to the line portion, and
a first distance between the protruding portion and the first vertical semiconductor pattern is less than a second distance between the line portion and the second vertical semiconductor pattern.

6. The device of claim 4, wherein the first source pattern contacts lower side surfaces of the plurality of vertical semiconductor patterns.

7. The device of claim 1, further comprising:
a third block spaced apart from the second block by the first block; and
a second insulating separation pattern interposed between the third block and the first block,
wherein the first source contact plug does not penetrate the second insulating separation.

8. The device of claim 7, wherein the first insulating separation pattern has a first width in the first direction, the second insulating separation pattern has a second width in the first direction, and the first width is greater than or equal to the second width.

9. The device of claim 1, further comprising:
a third block spaced apart from a first block by the second block;
a second insulating separation pattern interposed between the second block and the third block; and
a second source contact penetrating the second insulating separation pattern and electrically connected to the source layer.

10. The device of claim 1, wherein the first block has a first width in the first direction, the second block has a second width in the first direction, and the first width is greater than or equal to the second width.

11. The device of claim 1, further comprising:
a first conductive line extending over the first block and the second block;
first vertical semiconductor patterns penetrating the first block and overlapping the first conductive line; and
second vertical semiconductor patterns penetrating the second block and overlapping the first conductive line, wherein a number of the first vertical semiconductor patterns is different from a number of the second vertical semiconductor patterns.

12. The device of claim 1, further comprising:
a third block spaced apart from the second block by the first block, wherein the third block comprises electrode layers stacked on the first substrate,
wherein each of the first, second, and third blocks further includes electrode interlayer insulating layers interposed between the electrode layers, vertical semiconductor patterns penetrating the electrode interlayer insulating layers and the electrode layers, and memory patterns interposed between the vertical semiconductor patterns and the electrode layers, and
each of the first block and the second block does not serve as a memory block, and the third block serves as the memory block.

13. A three-dimensional semiconductor memory device, comprising:
a first block and a second block arranged on a first substrate and in a first direction;
a third block spaced apart from the second block by the first block;
a source layer interposed between the first block and the first substrate, and between the second block and the first substrate;
a first insulating separation pattern interposed between the first block and the second block and extending in a second direction crossing the first direction;
a second insulating separation pattern interposed between the first block and third block; and
a first source contact plug penetrating the first insulating separation pattern to electrically connect the source layer,
wherein the first insulating separation pattern comprises a first portion and a second portion, the first portion enclosing the first source contact plug, and the second portion connected to the first portion and extending in the second direction,
the first portion has a first width in the first direction, the second portion has a second width in the first direction, and the first width is greater than the second width,
each of the first block and second block does not serve as a memory block,
the third block serves as the memory block,
the second insulating separation pattern has a third width in the first direction, and
the third width is different from both the first width and the second width.

14. The device of claim 13, further comprising:
a plurality of vertical semiconductor patterns penetrating at least a portion of the first block and are spaced apart from each other,
wherein the vertical semiconductor patterns include a first vertical semiconductor pattern and a second vertical semiconductor pattern,
the first vertical semiconductor pattern is closest to the first portion, and
the second vertical semiconductor pattern is closest to the second portion, and
a first distance between the first portion and the first vertical semiconductor pattern is less than a second distance between the second portion and the second vertical semiconductor pattern.

15. The device of claim 13, wherein the first block has a fourth width in the first direction, the second block has a fifth width in the first direction, and the first width is different from the second width.

16. The device of claim 13, further comprising:
a first conductive line extending over the first block and the second block;
first vertical semiconductor patterns penetrating the first block and overlapping the first conductive line; and
second vertical semiconductor patterns penetrating the second block and overlapping the first conductive line,
wherein a number of the first vertical semiconductor patterns is different from a number of the second vertical semiconductor patterns.

17. A three-dimensional semiconductor memory device, comprising:
a first block and a second block arranged on a first substrate and in a first direction;
a source layer interposed between the first block and the first substrate, and between the second block and the first substrate;
a first insulating separation pattern interposed between the first block and the second block and extending in a second direction crossing the first direction;
a first source contact plug penetrating the first insulating separation pattern to electrically connect the source layer;
a first conductive line crossing over the first block and the second block;
first vertical semiconductor patterns penetrating the first block and overlapping the first conductive line; and
second vertical semiconductor patterns penetrating the second block and overlapping the first conductive line,
wherein a number of the first vertical semiconductor patterns is different from a number of the second vertical semiconductor patterns,
each of the first block and the second block includes alternately stacked electrode layers and electrode interlayer insulating layers disposed on the source layer, vertical semiconductor patterns penetrating the electrode interlayer insulating layers and the electrode layers, and memory patterns respectively interposed between the vertical semiconductor patterns and the electrode layers,
the first insulating separation pattern include a first portion and a second portion, the first portion enclosing the first source contact plug, and the second portion being connected to the first portion and extending in the second direction,
the vertical semiconductor patterns include a first vertical semiconductor pattern and a second vertical semiconductor pattern, the first vertical semiconductor pattern being closest to the first portion, and the second vertical semiconductor pattern being closest to the second portion, and
a first distance between the first portion and the first vertical semiconductor pattern is less than a second distance between the second portion and the second vertical semiconductor pattern.

18. The device of claim 17, wherein the second portion has a first width in the first direction, and the first width is less than the second distance.

19. The device of claim 18, wherein the first width ranges from 50 nm to 150 nm, and the second distance ranges 60 nm to 160 nm.

20. The device of claim 17, further comprising:
a peripheral logic structure disposed below the first substrate;
a plurality of second conductive lines crossing over the first block and the second block in the second direction; and
first through vias penetrating the second block and the first substrate to connect each of the second conductive lines to the peripheral logic structure, and arranged in the first direction to form a zigzag pattern.

* * * * *